US011108361B2

United States Patent
Khalil et al.

(10) Patent No.: US 11,108,361 B2
(45) Date of Patent: Aug. 31, 2021

(54) INTEGRATED MULTIPLE-PATH POWER AMPLIFIER WITH INTERDIGITATED TRANSISTORS

(71) Applicant: NXP USA, Inc., Austin, TX (US)

(72) Inventors: Ibrahim Khalil, Gilbert, AZ (US); Hussain Hasanali Ladhani, Tempe, AZ (US); Humayun Kabir, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 43 days.

(21) Appl. No.: 16/541,551

(22) Filed: Aug. 15, 2019

(65) Prior Publication Data

US 2021/0050820 A1 Feb. 18, 2021

(51) Int. Cl.
| | |
|---|---|
| H03F 3/68 | (2006.01) |
| H03F 1/02 | (2006.01) |
| H01L 23/66 | (2006.01) |
| H03F 1/56 | (2006.01) |
| H03F 3/195 | (2006.01) |
| H03F 3/21 | (2006.01) |

(52) U.S. Cl.
CPC ........... *H03F 1/0288* (2013.01); *H01L 23/66* (2013.01); *H03F 1/565* (2013.01); *H03F 3/195* (2013.01); *H01L 2223/6655* (2013.01); *H03F 3/211* (2013.01); *H03F 2200/451* (2013.01)

(58) Field of Classification Search
CPC ........ H03F 1/0288; H03F 3/195; H03F 1/565; H03F 2200/451; H03F 3/602; H03F 3/211; H03F 3/604; H01L 23/66; H01L 2223/6655

USPC ..................... 330/124 R, 286, 295
See application file for complete search history.

(56) References Cited

U.S. PATENT DOCUMENTS

| | | | |
|---|---|---|---|
| 5,786,727 A | 7/1998 | Sigmon | |
| 6,731,172 B2 | 5/2004 | Thompson | |
| 7,330,077 B2 | 2/2008 | Arnborg | |
| 7,764,120 B2 * | 7/2010 | Pengelly | ................. H03F 3/195 330/124 R |
| 7,800,448 B2 * | 9/2010 | Blednov | ............... H03F 1/0288 330/295 |
| 7,898,338 B2 * | 3/2011 | Blednov | ............... H03F 1/0288 330/295 |

(Continued)

*Primary Examiner* — Khanh V Nguyen
(74) *Attorney, Agent, or Firm* — Sherry W. Schumm

(57) ABSTRACT

A multiple-path amplifier (e.g., a Doherty amplifier) includes first and second amplifier input terminals and an amplifier output terminal integrally-formed with a semiconductor die, and at least two amplifier cells positioned adjacent to each other between the amplifier input terminals and the amplifier output terminal. Each amplifier cell includes first and second transistors (e.g., field effect transistors) integrally-formed with the semiconductor die, where the first and second transistors each include a transistor input (e.g., a gate terminal) and a transistor output (e.g., a drain terminal). The first transistor input is coupled to the first amplifier input terminal, and the second transistor input is coupled to the second amplifier input terminal. A combining node is coupled to the second transistor output and to the amplifier output terminal, and a first phase shift element (e.g., an inductor) is electrically connected between the first transistor output and the combining node.

21 Claims, 11 Drawing Sheets

(56) References Cited

U.S. PATENT DOCUMENTS

| | | | |
|---|---|---|---|
| 8,487,703 B2* | 7/2013 | Blednov | H03F 3/211 330/295 |
| 8,638,168 B1* | 1/2014 | Signoff | H03F 3/24 330/124 R |
| 8,710,924 B2* | 4/2014 | van der Zanden | H03F 1/0288 330/124 R |
| 8,736,375 B2* | 5/2014 | Murao | H03F 1/0288 330/295 |
| 9,407,214 B2 | 8/2016 | Pribble et al. | |
| 9,438,173 B2* | 9/2016 | Murao | H03F 3/211 |
| 9,978,691 B2* | 5/2018 | Kuo | H03F 1/0288 |
| 2006/0044060 A1* | 3/2006 | Shiikuma | H03F 3/602 330/124 R |
| 2012/0146732 A1* | 6/2012 | Murao | H03F 1/0266 330/295 |
| 2013/0120061 A1* | 5/2013 | van der Zanden | H03F 1/0288 330/124 R |
| 2014/0035680 A1* | 2/2014 | Chen | H03F 3/245 330/295 |
| 2014/0191805 A1 | 7/2014 | Cho et al. | |
| 2014/0312976 A1* | 10/2014 | Noori | H03F 3/195 330/295 |
| 2015/0188504 A1* | 7/2015 | kesson | H03F 1/56 330/286 |
| 2020/0136564 A1* | 4/2020 | Nakatani | H03F 1/0288 |

* cited by examiner

INTEGRATED MULTIPLE-PATH POWER AMPLIFIER WITH INTERDIGITATED TRANSISTORS

TECHNICAL FIELD

Embodiments of the subject matter described herein relate generally to power amplifiers with multiple sub-amplifiers, and more particularly to Doherty power amplifiers with carrier and peaking amplifiers and output combining circuits.

BACKGROUND

For many years, the Doherty power amplifier has been one of the most popular amplifiers for cellular infrastructure applications. A two-way Doherty amplifier includes two sub-amplifiers (i.e., a carrier amplifier and a peaking amplifier), which are connected in parallel between an amplifier input and an amplifier output. During operation, an input radio frequency (RF) signal is divided into carrier and peaking signals, and a phase difference of 90 degrees is applied between the carrier and peaking signals prior to amplification by the carrier and peaking amplifiers. On the output side, one of the amplified carrier or peaking signals is then conveyed through an n×90 degree transmission line (n=1, 2, ... ), while the other one of the amplified carrier or peaking signals is conveyed through an (n−1)×90 degree transmission line before the amplified signals are combined together by a signal combiner. This enables active loadpull of the carrier and peaking amplifiers.

In some typical Doherty amplifier configurations, the carrier and peaking amplifiers are implemented on two distinct semiconductor die (i.e., one die for the carrier amplifier, and another die for the peaking amplifier), which are mounted to a package substrate or a printed circuit board (PCB). For example, each of the carrier and peaking amplifiers may be implemented using a multi-finger field effect transistor, and within each die, amplified signals produced by each transistor finger are combined at an output bond pad. Wirebond arrays are typically used to convey the amplified carrier and peaking signals from the output bond pads to output leads or to conductive structures on the package substrate or PCB. In a 90-0 Doherty amplifier configuration, either the amplified carrier signal or the amplified peaking signal is conducted through a conductor (e.g., a transmission line) that has a 90-degree electrical length (e.g., a quarter wavelength transmission line) prior to combining the signals. Similarly, in a 90-180 Doherty amplifier configuration, either the amplified carrier signal or the amplified peaking signal is conducted through a transmission line that has a 90-degree electrical length, and the other one of the amplified carrier signal or the amplified peaking signal is conducted through a conductor (e.g., a transmission line) that has a 180-degree electrical length (e.g., a half wavelength transmission line) prior to combining the signals.

The number of transistor fingers utilized for each of the carrier and peaking amplifiers is directly proportional to the desired output power level. Accordingly, more transistor fingers are used for higher-power amplifiers, which necessitates the use of relatively long output bond pads to interconnect the transistor finger outputs in such amplifiers. Unfortunately, at higher frequencies (e.g., in the gigahertz (GHz) range), the distributed nature of output bond pads that are used to combine numerous transistor fingers may result in significant and undesirable signal power loss. More specifically, as the wavelength of an RF signal being amplified approaches the physical dimensions of a transistor block, a relatively large phase difference may result between the signals at the edge fingers of each of the amplifiers. Large phase discrepancies may result in significant signal power loss, which in turn may translate to relatively poor power added efficiency at the circuit level. Accordingly, what is needed is a more power-efficient Doherty amplifier design that is capable of supporting amplification at high frequencies with relatively low losses.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
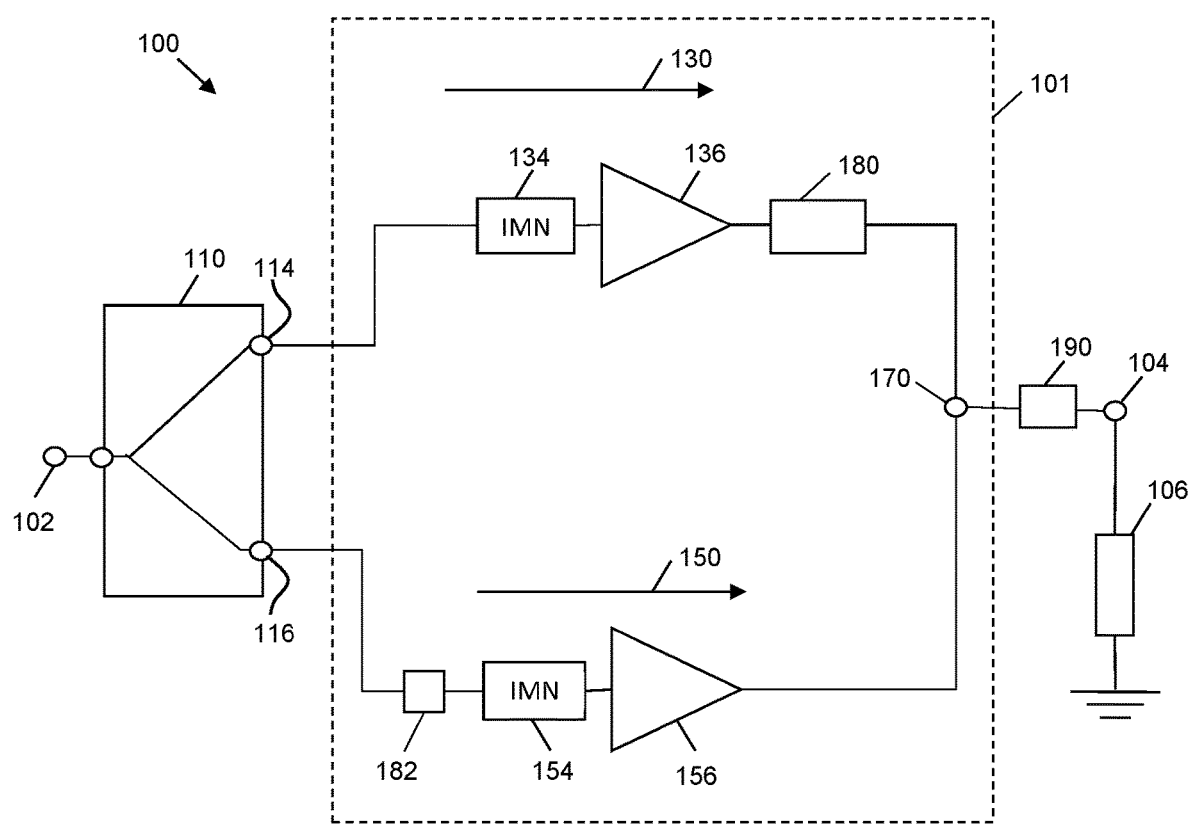
FIG. 1 is a simplified schematic of a Doherty power amplifier, in accordance with an example embodiment.

Embodiments of the inventive subject matter include a multiple-path amplifier (i.e., an amplifier with multiple amplifiers that amplify signals in parallel) with integrated and interdigitated first and second power transistor fingers, integrated phase shifters, and integrated signal combiners coupled to the outputs of the first and second power transistor fingers. In some embodiments, the multiple path amplifier may be a Doherty power amplifier. More specifically, some of the below-described embodiments correspond to a Doherty power amplifier with a "non-inverted" load network configuration (also known as a "non-inverted" Doherty amplifier). Those of skill in the art would understand, based on the description herein, that the below-described embodiments also may be implemented in a Doherty power amplifier with an "inverted" load network configuration (also known as an "inverted" Doherty amplifier). In addition, some of the below-described and illustrated embodiments of Doherty amplifier ICs correspond to two-way Doherty amplifiers that include a carrier amplifier and one peaking amplifier (each consisting of a plurality of parallel-coupled transistor fingers). As will be explained in more detail later, other embodiments may include "N-way" Doherty power amplifiers, where N>2, and in which the number of peaking amplifiers equals N−1. Further still, the below-described embodiments may be implemented in multiple-path amplifiers other than Doherty power amplifiers. Accordingly, the scope of the inventive subject matter is not limited to two-way, non-inverted Doherty power amplifiers, but is broad enough to cover inverted Doherty power amplifiers, N-way Doherty amplifiers (where N>2), and other types of multiple-path amplifiers.

As used herein and as will be described in detail later, a transistor "finger", which also may be referred to as a "sub-amplifier", includes an elongated (i.e., having a length significantly greater than a width) transistor structure with a plurality of parallel-aligned doped semiconductor regions and contact regions. In some embodiments, the multiple-path amplifier may be a Doherty power amplifier, with a plurality of integrated and interdigitated pairs or sets of carrier power transistor fingers (also referred to as "carrier fingers" or "carrier sub-amplifiers") and peaking power transistor fingers (also referred to as "peaking fingers" or "peaking sub-amplifiers"), and an integrated phase shifter (e.g., an inductance) between each carrier or peaking transistor output terminal and an output combiner, to which all of the carrier and peaking finger outputs are coupled.

In various embodiments, the carrier and peaking fingers, the phase shifter, and the output combiner are integrated and/or monolithically formed with or within a single integrated circuit (IC) die (or semiconductor die). As used herein, the terms "monolithic" or "monolithically formed" mean integrated with or within a single semiconductor die. When a component is referred to herein as being "integrally-formed" with an IC or semiconductor die, this means that the component structure forms a portion of the die itself (e.g., the component is created during the die fabrication process, and is physically located between the top and bottom surfaces of the die). For example, referring briefly to FIG. 3, transistor fingers 336 and 356 and inductor 380 are considered to be "integrally-formed" with die 301. In contrast, when a component is referred to as being "integrated" with an IC or semiconductor die, this means that the component structure either is "integrally-formed" with the die, or the component is attached to the die (e.g., mounted to the surface of the die). For example, referring briefly to FIG. 6, inductor 680 is considered to be "integrated" with die 601, as that term is used herein, because the terminals 682, 684 of inductor 680 are physically and electrically attached to bondpads 683, 685 exposed at the surface of die 601.

As indicated above, an embodiment of a Doherty amplifier includes an integrated or integrally-formed output combiner coupled to the outputs of multiple carrier and peaking fingers. In non-inverted Doherty amplifier embodiments, the output combiner is closely electrically coupled to the outputs (e.g., intrinsic drain terminals) of the peaking fingers, where "closely electrically coupled," as used herein, means directly connected or electrically coupled through one or more conductive features (e.g., integrated conductive trace(s) and/or via(s)) that form a conductive path which has a negligible total electrical resistance (e.g., less than about 100 milliohms) and which is devoid of passive or active electrical components (e.g., discrete or integrated resistors, inductors, capacitors, or transistors). In inverted Doherty amplifier embodiments, the output combiner is closely electrically coupled to the outputs (e.g., intrinsic drain terminals) of the carrier fingers.

Because the output combiner may be implemented very close to the intrinsic drain(s) of the peaking fingers, a 90-0 Doherty amplifier may be achieved, in which a phase shift of about 90 degrees is implemented between the drain regions of the carrier fingers and the drain regions of the peaking fingers, and no substantial phase shift is implemented between the drain regions of the peaking fingers and the output combiner. According to an embodiment, the 90-degree phase difference between the carrier and peaking finger outputs is provided by circuitry having a CLC (capacitance-inductance-capacitance) topology. The CLC topology includes the drain-source capacitances of the carrier and peaking fingers, in combination with a tightly-controllable series inductance (e.g., inductor 380, 680, 780, 781, 880, 980, 1080, 1081, 1180, 1181, 1380, 1381, FIGS. 3, 6, 7-11, 13) implemented between each carrier finger output and the output combiner. More specifically, the CLC topology essentially is a pi-network with a first shunt capacitance (carrier finger drain-source capacitance), a second shunt capacitance (peaking finger drain-source capacitance), and an inductance coupled between the carrier and peaking drain terminals. In other words, wherein the drain-source capacitance of the carrier finger, the drain-source capacitance of the peaking finger, and the inductance of the inductor result in a 90-degree phase delay being imparted to a radio frequency signal conveyed between the drain region of the carrier finger and the output combiner (or the combining node).

The basic structure of a Doherty power amplifier will now be described for enhanced understanding of the remainder of the specification. FIG. 1 is a simplified schematic of a two-way, non-inverted Doherty power amplifier 100, in accordance with an example embodiment. Doherty amplifier 100 includes an input node 102, an output node 104, a power splitter 110 (or divider), a carrier amplification path 130, a peaking amplification path 150, an input phase shifter 182, an output phase shifter 180, and a combining node 170. A load 106 may be coupled to the combining node 170 (e.g., through impedance transformer 190 and output node 104) to receive an amplified RF signal from amplifier 100.

Doherty power amplifier 100 is considered to be a "two-way" Doherty power amplifier, which includes one carrier amplifier 136 and one or more peaking amplifier 156. The carrier amplifier 136 provides amplification along the carrier amplification path 130, and the peaking amplifier 156 provides amplification along the peaking amplification path 150. In other embodiments, more than one peaking amplifier may be implemented in parallel with the first peaking amplifier 156 to produce an N-way Doherty power amplifier, where N>2.

Although the carrier and peaking amplifiers 136, 156 may be of equal size (e.g., in a symmetric Doherty configuration with a 1:1 main-to-peaking size ratio), the carrier and peaking amplifiers 136, 156 may have unequal sizes, as well (e.g., in various asymmetric Doherty configurations). In a symmetric two-way Doherty amplifier configuration, the peaking power amplifier 156 and the carrier power amplifier 136 are approximately the same size, where "size" refers to the total transistor periphery and/or current carrying capacity. Conversely, in an asymmetric two-way Doherty amplifier configuration, the peaking power amplifier 156 typically is larger in size than the carrier power amplifier 136 by some multiplier. For example, the peaking power amplifier 156 may be twice the size of the carrier power amplifier 136 so that the peaking power amplifier 156 has twice the current carrying capacity of the carrier power amplifier 136. Asymmetric carrier-to-peaking amplifier size ratios other than a 1:2 ratio may be implemented, as well.

Power splitter 110 is configured to divide the power of an input RF signal received at input node 102 into carrier and peaking portions of the input signal. The carrier input RF signal is provided to the carrier amplification path 130 at power splitter output 114, and the peaking input RF signal is provided to the peaking amplification path 150 at power splitter output 116. During operation in a low-power mode when only the carrier amplifier 136 is supplying current to the load 106, the power splitter 110 provides the input signal power only to the carrier amplification path 130. During operation in a full-power mode when both the carrier and peaking amplifiers 136, 156 are supplying current to the load 106, the power splitter 110 divides the input signal power between the amplification paths 130, 150.

Power splitter 110 may divide the power of the input RF signal equally or unequally. For example, when Doherty amplifier 100 has an asymmetric Doherty amplifier configuration in which the peaking amplifier 156 is approximately twice the size of the carrier amplifier 136 (i.e., the Doherty amplifier 100 has an asymmetric configuration with a 1:2 carrier-to-peaking size ratio), the power splitter 110 may divide the power such that roughly one third of the input signal power is provided to the carrier amplification path 130, and roughly two thirds of the input signal power is provided to the peaking amplification path 150. In other words, with a 1:2 carrier-to-peaking size ratio, the size of the peaking amplifier 156 is about twice the size of the carrier amplifier 136, and the power splitter 110 is configured to produce a peaking input signal with about twice the power of the carrier input signal.

Alternatively, in the case of a symmetric Doherty amplifier configuration (i.e., the carrier-to-peaking size ratio is about 1:1), the power splitter 110 may divide the power so that about half of the input signal power is provided to the carrier amplification path 130 at power splitter output 114, and about half of the input signal power is provided to the peaking amplification path 150 at power splitter output 116.

Essentially, the power splitter 110 divides an input RF signal supplied at the input node 102, and the divided signals are separately amplified along the carrier and peaking amplification paths 130, 150. The amplified signals are then combined in phase at the combining node 170. It is important that phase coherency between the carrier and peaking amplification paths 130, 150 is maintained across a frequency band of interest (or operational frequency band) to ensure that the amplified carrier and peaking signals arrive in phase at the combining node 170, and thus to ensure proper Doherty amplifier operation. In the Doherty amplifier configuration depicted in FIG. 1 (i.e., a non-inverted Doherty configuration), an input phase shifter 182 is coupled between power splitter output 116 and the peaking amplifier 156. According to an embodiment, the input phase shifter 182 applies about 90 degrees of phase delay to the peaking input signal before it is provided to the peaking amplifier 156. For example, the input phase shifter 182 may include a quarter wave transmission line, a lumped-element delay circuit, or another suitable type of delay element or circuit with an electrical length of about 90 degrees.

According to an embodiment, the carrier amplifier 136 and the peaking amplifier 156 each are a single-stage amplifier (i.e., an amplifier with a single amplification stage). In other embodiments, the carrier amplifier 136 is a two-stage amplifier, which includes a relatively low-power pre-amplifier (not shown) and a relatively high-power final-stage amplifier (not shown) connected in a cascade (or series) arrangement between a carrier amplifier input and a carrier amplifier output. In the carrier amplifier cascade arrangement, an output of the pre-amplifier is electrically coupled to an input of the final-stage amplifier. Similarly, the peaking amplifier 156 may include a two-stage amplifier, which includes a relatively low-power pre-amplifier (not shown) and a relatively high-power final-stage amplifier (not shown) connected in a cascade arrangement between a peaking amplifier input and a peaking amplifier output. In the peaking amplifier cascade arrangement, an output of the pre-amplifier is electrically coupled to an input of the final-stage amplifier. In other embodiments, each of the carrier amplifier 136 and the peaking amplifier 156 may include more than two, cascade-coupled amplification stages. Input impedance matching networks 134, 154 (IMN) may be implemented, respectively, at the input of each amplifier 136, 156. In each case, the matching networks 134, 154 may incrementally increase the circuit impedance toward the load impedance.

During operation of Doherty amplifier 100, the carrier amplifier 136 is biased to operate in class AB mode or deep class AB mode, and the peaking amplifier 156 typically is biased to operate in class C mode. In some configurations, the peaking amplifier 156 may be biased to operate in class B or deep class B modes. For example, gate biasing of the carrier and peaking amplifiers 136, 156 may be performed using one or more gate bias circuits (e.g., bias circuits 220, 222, FIG. 2), in an embodiment. At low power levels, where the power of the input signal at node 102 is lower than the turn-on threshold level of peaking amplifier 156, the amplifier 100 operates in a low-power mode in which the carrier amplifier 136 is the only amplifier supplying current to the load 106. When the power of the input signal exceeds a threshold level of the peaking amplifier 156, the amplifier 100 operates in a high-power mode in which the carrier amplifier 136 and the peaking amplifier 156 both supply current to the load 106. At this point, the peaking amplifier 156 provides active load modulation at combining node 170, allowing the current of the carrier amplifier 136 to continue to increase linearly.

Doherty amplifier 100 has a "non-inverted" load network configuration. In the non-inverted configuration, the input circuit is configured so that the input signals supplied to the peaking amplifier 156 are delayed by 90 degrees with respect to the input signal supplied to the carrier amplifier 136 at the center frequency of operation, f0, of the amplifier 100. To ensure that the carrier and peaking input RF signals arrive at the carrier and peaking amplifiers 136, 156 with about 90 degrees of phase difference, as is fundamental to proper Doherty amplifier operation, input phase shifter 182 applies about 90 degrees of phase delay to the peaking input signal before it is provided to the peaking amplifier 156, as described above.

To compensate for the 90 degree phase delay difference between the carrier and peaking amplification paths 130, 150 at the inputs of amplifiers 136, 156 (i.e., to ensure that the amplified signals arrive in phase at the combining node 170), the output phase shifter 180 is configured to apply about a 90 degree phase delay to the signal between the output of carrier amplifier 136 and the combining node 170. As will be described in more detail in conjunction with FIGS. 2-13, the output phase shifter 180 may include one or more inductive components (e.g., inductors 380, 680, FIGS. 2-13) coupled between the output of the carrier amplifier 136 and the combining node 170. For example, the output phase shifter 180 may include combinations of integrated spiral inductors, discrete inductors, wirebonds, and integrated transmission lines, as will be discussed in more detail in conjunction with FIGS. 2-13.

Alternate embodiments of Doherty amplifiers may have an "inverted" load network configuration. In such a configuration, the amplifier is configured so that an input phase shifter delays an input signal supplied to the carrier amplifier 136 by about 90 degrees with respect to the input signal supplied to the peaking amplifier 156 at the center frequency of operation, f0, of the amplifier 100, and an output phase shifter is configured to apply about a 90 degree phase delay to the signal between the output of the peaking amplifier 156 and the combining node, whereas no significant delay is applied to the signal between the output of the carrier amplifier 136 and the combining node.

Doherty amplifier 100 is "integrated," as that term is used herein, because at least the carrier amplifier 136, the peaking amplifier 156, the phase shifter 180, and the combining node 170 are integrated with or within one single IC die, as indicated by dashed box 101 (e.g., die 301, 501, 601, 701, 801, 901, 1001, 1101, 1201, 1301 FIGS. 3, 5-13). Such a die may be referred to herein as an "integrated Doherty amplifier die." According to an embodiment, all or portions of the input impedance matching networks 134, 154 also may be integrated with or within the same IC die 101 (e.g., die 301, 501, 601, 701, 801, 901, 1001, 1101, 1201, 1301 FIGS. 3, 5-13). Further, the splitter 110 may be integrated with or within the same IC die 101. Alternatively, all or portion of the splitter 110 and/or input impedance matching networks 134, 154 may be implemented in one or more components that are distinct from the IC die that includes the carrier and peaking amplifiers 136, 156.

As mentioned above, each of the carrier amplifier 136 and the peaking amplifier 156 includes a plurality of transistor "fingers". Essentially, each finger of an amplifier functions as a small sub-amplifier. The transistor fingers (or sub-amplifiers) for the carrier amplifier 136 (referred to herein as "carrier fingers") are connected in parallel between a carrier amplifier input and the combining node 170, and the transistor fingers (or sub-amplifiers) for the peaking amplifier 156 (referred to herein as "peaking fingers") are connected in parallel between a peaking amplifier input and the combining node. According to an embodiment, a phase delay element (corresponding to phase shifter 180) is coupled between the output (e.g., intrinsic drain) of each carrier finger and the combining node. According to a further embodiment, the carrier fingers and the peaking fingers are interdigitated (or interleaved with each other) to form a plurality of "Doherty amplifier cells" that amplify an input RF signal in parallel. This unique amplifier structure is depicted in circuit schematic form in FIG. 2.

Figure 2:
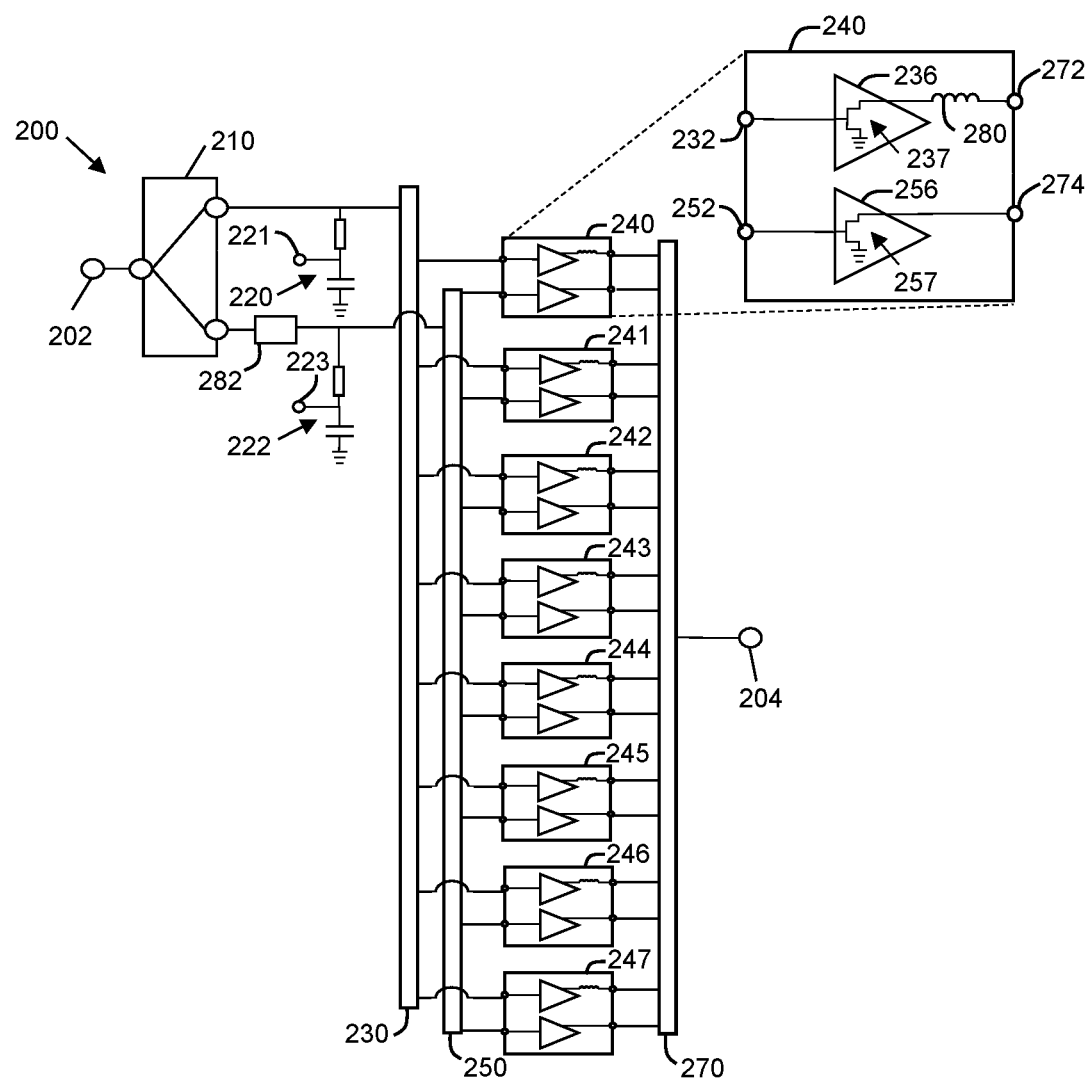
FIG. 2 is a schematic of a Doherty power amplifier with interdigitated carrier and peaking sub-amplifiers, in accordance with an example embodiment.

More specifically, FIG. 2 is a schematic of a Doherty power amplifier 200 with interdigitated carrier and peaking sub-amplifiers (or fingers), in accordance with an example embodiment. Doherty amplifier 200 includes an input node 202 (e.g., input node 101, FIG. 1), an output node 204 (e.g., output node 104, FIG. 1), a power splitter 210 (e.g., power splitter 110, FIG. 1), a carrier bias circuit 220, a peaking bias circuit 222, a first phase shifter 282 (e.g., phase shifter 182, FIG. 1), a carrier input signal manifold 230, a peaking input signal manifold 250, an output signal combiner manifold 270, and a plurality of "Doherty cells" 240, 241, 242, 243, 244, 245, 246, 247 coupled in parallel between the carrier and peaking input signal manifolds 230, 250 and the output signal combiner manifold 270. Although FIG. 2 illustrates eight Doherty cells 240-247 coupled in parallel, more or fewer Doherty cells 240-247 (e.g., from two to fifty cells) may be included in other embodiments of Doherty amplifier 200.

The power splitter 210 is coupled between the input node 202 and the carrier and peaking input signal manifolds 230, 250. The power splitter 210 is configured to divide the power of an input RF signal received at input node 202 into carrier and peaking portions of the input signal, which are produced at carrier and peaking signal outputs, respectively, of the power splitter 210.

The first phase shifter 282 is coupled between the peaking signal output of the power splitter 210 and the peaking input signal manifold 250. According to an embodiment, the first phase shifter 282 applies about 90 degrees of phase delay to the peaking input signal before it is provided to the peaking input signal manifold 250. For example, the first phase shifter 282 may include a quarter wave transmission line, a lumped-element delay circuit, or another suitable type of delay element or circuit with an electrical length of about 90 degrees. The first phase shifter 282 functions to impart a 90 degree phase difference between the carrier and peaking input signals when the arrive at the carrier and peaking input signal manifolds 230, 250, respectively. In other embodiments, the power splitter 210 may impart the 90 degree phase difference between the carrier and peaking input signals, or other circuitry may be utilized to impart the 90 degree phase difference.

The plurality of Doherty cells 240-247 are coupled in parallel between the carrier and peaking input signal manifolds 230, 250 and the output signal combiner manifold 270. Referring to the enlarged Doherty cell 240, each Doherty cell 240 includes parallel carrier and peaking amplification paths (e.g., paths 130, 150, FIG. 1). The carrier path includes a carrier input terminal 232, a carrier sub-amplifier 236, a second phase shifter 280, and a carrier output terminal 272. Similarly, the peaking path includes a peaking input terminal 252, a peaking sub-amplifier 256, and a peaking output terminal 274. The carrier input terminals 232 for all of the Doherty cells 240-247 are electrically coupled to the carrier input signal manifold 230, and the peaking input terminals 252 for all of the Doherty cells 240-247 are electrically coupled to the peaking input signal manifold 250. The carrier and peaking output terminals 272, 274 for all of the Doherty cells 240-247 are electrically coupled to the output signal combiner manifold 270, which functions as the combining node (e.g., combining node 170, FIG. 1) for all the RF signals amplified by the carrier and peaking paths of the Doherty cells 240-247.

As will be described in more detail in conjunction with FIGS. 3-13, each carrier and peaking sub-amplifier 236, 256 may be implemented, for example, with one or more transistor fingers, where each transistor finger corresponds to a field effect transistor (FET) with a control terminal (or gate terminal) and first and second current conducting terminals (or drain and source terminals). Accordingly, in FIG. 2, each carrier and peaking sub-amplifier 236, 256 is depicted as a three-terminal FET. The FET 237 for the carrier sub-amplifier 236 has a control terminal (e.g., a gate terminal) coupled to the carrier input signal manifold 230 through the carrier input terminal 232, a first current conducting terminal (e.g., a drain terminal) coupled to the output signal combiner manifold 270 through the phase shifter 280 and the carrier output terminal 272, and a second current conducting terminal (e.g., a source terminal) coupled to a ground voltage reference. Similarly, the FET 257 for the peaking sub-amplifier 256 has a control terminal (e.g., a gate terminal) coupled to the peaking input signal manifold 250 through the peaking input terminal 252, a first current conducting terminal (e.g., a drain terminal) coupled to the output signal combiner manifold 270 through the peaking output terminal 274, and a second current conducting terminal (e.g., a source terminal) coupled to a ground voltage reference.

The phase shifter 280 in the carrier path is configured to impart a predetermined phase delay to the amplified RF signal received from the first current conducting terminal (e.g., the drain terminal) of the FET 237 for the carrier sub-amplifier 236. According to an embodiment, the predetermined phase delay may be about 90 degrees or less, in order to impart a total phase delay between the first current conducting terminal (or more specifically the intrinsic drain of FET 237) and the output signal combiner manifold 270.

On the input side of each Doherty cell 240-247, the carrier input terminal 232 of each Doherty cell 240-247 is electrically coupled to the carrier input signal manifold 230, and the peaking input terminal 252 of each Doherty cell 240-247 is electrically coupled to the peaking input signal manifold 250. On the output side of each Doherty cell 240-247, the output terminals 272, 274 of each Doherty cell 240-247 is electrically coupled to the output signal combiner manifold 270.

Each of the carrier input signal manifold 230, the peaking input signal manifold 250, and the output signal combiner manifold 270 may include an elongated conductive structure (e.g., one or more patterned conductive lines or traces) that span a width of the Doherty cells 240-247. Accordingly, the carrier input signal manifold 230 is physically configured to facilitate electrical connection of all of the carrier input terminals 232 of all of the Doherty cells 240-247 to the carrier input signal manifold 230. Similarly, the peaking input signal manifold 250 is physically configured to facilitate electrical connection of all of the peaking input terminals 263 of all of the Doherty cells 240-247 to the peaking input signal manifold 250. The carrier and peaking input signal manifolds 230, 250 are electrically isolated from each other, and thus the carrier and peaking input signals also are electrically isolated from each other when they arrive at the Doherty cells 240-247. On the output side, the output signal combiner manifold 270 is physically configured to facilitate electrical connection of all of the output terminals 272, 274 of all of the Doherty cells 240-247 to the output signal combiner manifold 270. Accordingly, the output signal combiner manifold 270 is configured to combine all of the amplified signals from the carrier and peaking paths of all Doherty cells 240-247.

The carrier amplifier (e.g., carrier amplifier 136, FIG. 1) of Doherty amplifier 200 consists of the plurality of parallel-coupled carrier sub-amplifiers 236 in all of the Doherty cells 240-247, and the peaking amplifier (e.g., peaking amplifier 156, FIG. 1) of Doherty amplifier 200 consists of the plurality of parallel-coupled peaking sub-amplifiers 236 in all of the Doherty cells 240-247. As illustrated in FIG. 2, the carrier and peaking sub-amplifiers 236, 256 are interdigitated (or interleaved) across the plurality of cells 240-247. In other words, starting from Doherty cell 240 and proceeding toward Doherty cell 247, the carrier and peaking sub-amplifiers 236, 256 are physically arranged in a strictly alternating arrangement (e.g., carrier sub-amplifier, peaking sub-amplifier, carrier sub-amplifier, peaking sub-amplifier, and so on), in an embodiment. In other embodiments, the carrier and peaking sub-amplifiers 236, 256 may be interleaved, but not in a strictly alternating arrangement. For example, starting from Doherty cell 240 and proceeding toward Doherty cell 247, the carrier and peaking sub-amplifiers 236, 256 may be physically arranged so that there is a carrier sub-amplifier 236 followed by two peaking sub-amplifiers 256, followed by two carrier sub-amplifiers 236, and so on. Other interdigitated arrangements also could be utilized. In any event, the carrier and peaking sub-amplifiers 236, 256 are positioned adjacent to each other across the width of the device.

During operation of Doherty power amplifier 200, the carrier bias circuit 220 provides a first DC bias voltage (from a first bias voltage input 221) to the carrier input signal manifold 230, in order to bias the carrier sub-amplifiers 236 of each Doherty cell 240-247 to operate in class AB mode or deep class AB mode. Similarly, the peaking bias circuit 222 provides a second DC bias voltage (from a second bias voltage input 223) to the peaking input signal manifold 250, in order to bias the peaking sub-amplifiers 256 of each Doherty cell 240-247 to operate in class B or deep class B mode. Each of the bias circuits 220, 222 include circuitry (e.g., a quarter wave transmission line) that presents a high impedance to RF signal energy, in order to inhibit RF signal energy from being conveyed to the bias voltage inputs 221, 223.

An input RF signal is received at input node 202, and the input RF signal is divided by power splitter 210 into a carrier input RF signal and a peaking input RF signal, which are conveyed at the carrier and peaking signal outputs, respectively, of the power splitter 210. The peaking input signal is delayed by the first phase shifter 282 by about 90 degrees, so that the carrier input signal and the peaking input signal are about 90 degrees out of phase with each other when they arrive at the carrier and peaking input signal manifolds 230, 250, respectively. The carrier input signal manifold 230 conveys the carrier input signal to the carrier input terminal 232 of each Doherty cell 240-247, and the peaking input signal manifold 250 conveys the peaking input signal to the peaking input terminal 252 of each Doherty cell 240-247. Each Doherty cell 240-247 amplifies received carrier and peaking input signals, and produces amplified carrier and peaking RF signals at carrier and peaking output terminals 272, 274, respectively. The amplified carrier and peaking RF signals from each Doherty cell 240-247 are received at and combined by the output signal combiner manifold 270, and the combined output RF signal is produced at output node 204.

Figure 3:
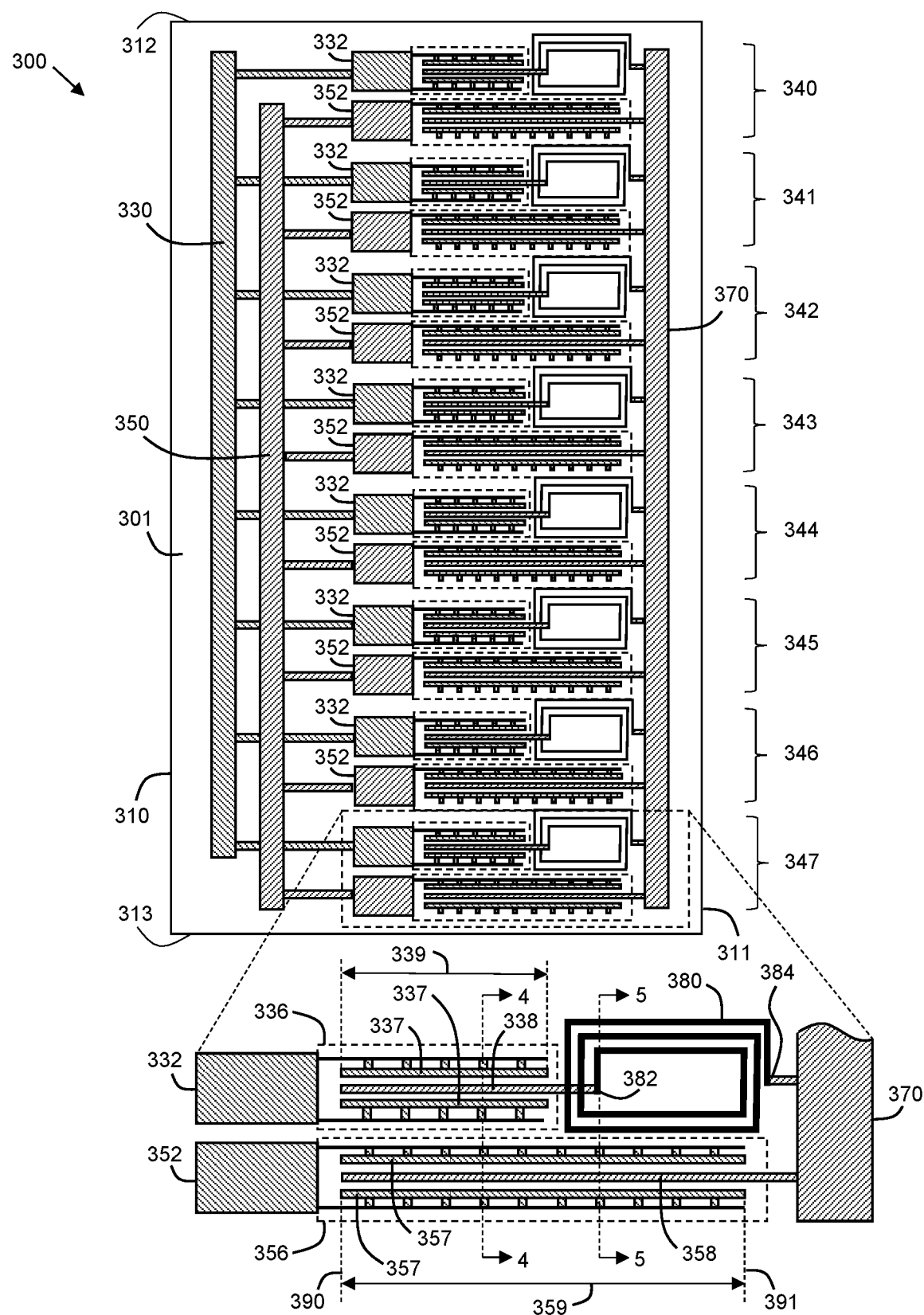
FIG. 3 is a top view of an asymmetric power amplifier integrated circuit (IC) with a plurality of asymmetric Doherty cells and interdigitated carrier and peaking fingers, in accordance with an example embodiment.

An embodiment of a physical implementation of an integrated circuit (IC) that embodies the carrier and peaking input signal manifolds 230, 250, the plurality of Doherty cells 240-247, and the output signal combiner manifold 270 will now be discussed in conjunction with FIGS. 3-5. More specifically, FIG. 3 is a top view of an asymmetric Doherty power amplifier IC 300 ("Doherty IC") with a plurality of asymmetric Doherty cells 340-347 and interdigitated carrier and peaking fingers 336, 356, in accordance with an example embodiment. Doherty cell 347 is shown enlarged in FIG. 3 to more clearly illustrate various features of the invention. For enhanced understanding, FIG. 3 should be viewed simultaneously with FIGS. 4 and 5, which are side, cross-sectional views of Doherty cell 347 of FIG. 3 along lines 4-4 and 5-5, respectively, in accordance with an example embodiment.

Figure 4:
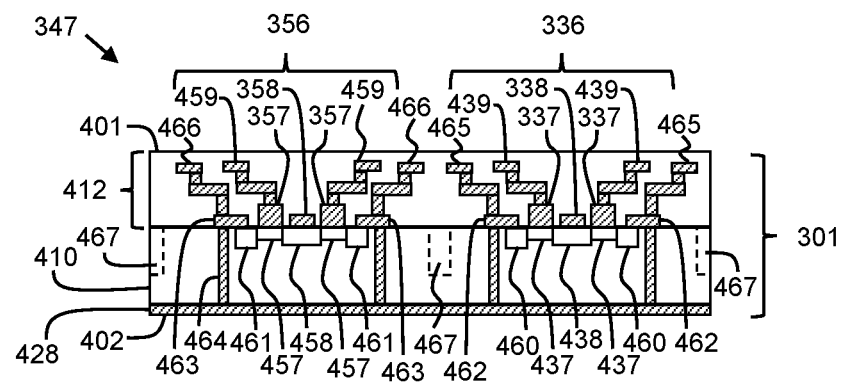
FIG. 4 is a side, cross-sectional view of a Doherty cell of FIG. 3 along line 4-4, in accordance with an example embodiment.
Figure 5:
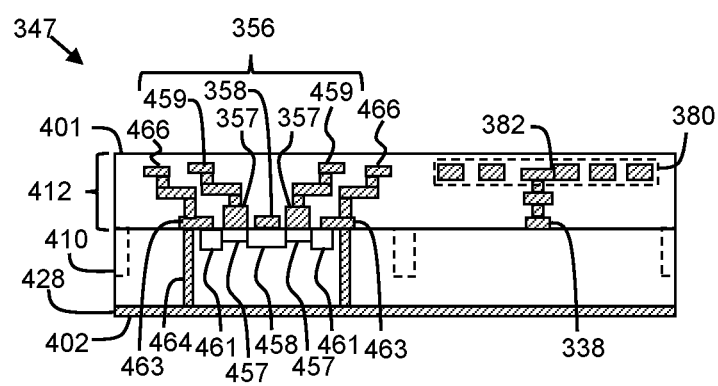
FIG. 5 is a side, cross-sectional view of a Doherty cell of FIG. 3 along line 5-5, in accordance with an example embodiment.

The components of Doherty IC 300 are integrally-formed, in the embodiment of FIGS. 3-5 (i.e., the components form portions of the die 301 and are physically located between the top and bottom surfaces 401, 402 of the die 301). In other embodiments, some of the components may be integrated with the IC (e.g., attached to the die, rather than being integrally-formed with the die). As used herein, the terms "integrated circuit die" and "IC die" mean a single, distinct semiconductor die (or semiconductor substrate) within which one or more circuit components (e.g., transistors, passive devices, and so on) are integrally-formed and/or directly physically connected to produce a monolithic structure.

Doherty IC 300 is a monolithic semiconductor device, in an embodiment. More specifically, the components of IC 300 form portions of a single semiconductor die 301. Die 301 includes a base semiconductor substrate 410 and a build-up structure 412 that includes a plurality of dielectric and patterned conductive layers and structures on and over a top surface of the base semiconductor substrate 410. The top surface of the build-up structure 412 defines the top surface 401 of die 301. According to an embodiment, a conductive layer 428 is formed on a bottom surface of the base semiconductor substrate 410 to define the bottom surface 402 of die 301.

The conductive layer 428 also functions as a ground reference node for the die 301. As used herein, a "ground reference node" means a conductive feature that is integrally-formed with the semiconductor die 301, and which is configured to be electrically coupled to an external conductive feature which, in turn, may be electrically coupled to a ground reference voltage. Thus, although not shown in FIGS. 4-5, when the Doherty IC 300 ultimately is packaged, the conductive layer 428 may be physically and electrically coupled to a ground node of a package substrate (e.g., flange 1420, FIG. 14). In other embodiments, the "ground reference node" may be an integrally-formed conductive feature of die 301 other than conductive layer 428 (e.g., the ground reference node may be a bondpad, the end(s) of one or more conductive vias, or other integrally-formed conductive features).

In a particular example embodiment, the base semiconductor substrate 410 is a high-resistivity silicon substrate (e.g., a silicon substrate having bulk resistivity in a range of about 500 ohm-centimeter (cm) to about 100,000 ohm-cm or greater). Alternatively, the base semiconductor substrate 410 may be a semi-insulating gallium arsenide (GaAs) substrate (e.g., a GaAs substrate having bulk resistivity up to $10^8$ ohm-cm), or another suitable high-resistivity substrate. An advantage to the use of a high-resistivity substrate is that such a substrate may enable various on-die circuitry to exhibit relatively low losses, when compared with amplifier ICs that do not utilize a high-resistivity substrate. In still other alternate embodiments, the base semiconductor substrate 410 may be any of multiple variants of a silicon substrate, a silicon-germanium substrate, a gallium nitride (GaN) substrate, another type of III-V semiconductor substrate, or some other type of semiconductor substrate.

The build-up structure 412 may include, for example, a plurality of alternating dielectric and patterned conductive layers, along with other conductive structures (e.g., conductive polysilicon structures). Within build-up structure 412, portions of different patterned conductive layers and conductive structures are electrically coupled with conductive vias. In addition, conductive through substrate vias (TSVs) (e.g., TSV 464) may provide conductive paths between the top and bottom surfaces of the base semiconductor substrate 410. The TSVs may or may not be lined with dielectric material to insulate the TSVs from the base semiconductor substrate 410.

The circuitry implemented in Doherty IC 300 corresponds to a portion of the schematic of Doherty amplifier 200 in FIG. 2. More specifically, Doherty IC 300 includes a carrier input signal manifold 330 (e.g., carrier manifold 230, FIG. 2), a peaking input signal manifold 350 (e.g., peaking manifold 250, FIG. 2), an output signal combiner manifold 370 (e.g., output manifold 270, FIG. 2), and a plurality of Doherty cells 340, 341, 342, 343, 344, 345, 346, 347 (e.g., Doherty cells 240-247, FIG. 2). The carrier and peaking input signal manifolds 330, 350 are positioned at an "input-side" of the IC 300 (i.e., a first side of the Doherty cells 340-347), and the output signal combiner manifold 370 is positioned at an "output-side" of the IC 300 (i.e., a second, opposite side of the Doherty cells 340-347). Although FIG. 3 illustrates eight Doherty cells 340-347 coupled in parallel, more or fewer Doherty cells 340-347 may be included in other embodiments of Doherty IC 300.

The carrier input signal manifold 330 and the peaking input signal manifold 350 are electrically isolated from each other on the input-side of the Doherty cells 340-347 so that each manifold 330, 350 may receive an input signal independently from the other (i.e., the carrier input signal manifold 330 receives a carrier input signal, and the peaking input signal manifold 350 receives a peaking input signal). Each of the carrier input signal manifold 330, the peaking input signal manifold 350, and the output signal combiner manifold 370 may include an elongated conductive feature, at least a portion of which is exposed at the top surface 401 of the die 301. For example, each of the manifolds 330, 350, 370 may be an elongated conductive bondpad or a conductive land. In the illustrated embodiment, each manifold 330, 350, 370 has a length (vertical dimension in FIG. 3) that is approximately equal to the combined widths (vertical dimension in FIG. 3) of the Doherty cells 340-347. In alternate embodiments, some or all of the manifolds 330, 350, 370 may be shorter or longer that the combined widths of the Doherty cells 340-370. In embodiments in which the manifolds 330, 350, 370 are bondpads, the manifolds 330, 350, 370 may be configured for attachment of one or more wirebond arrays (e.g., wirebonds 1432, 1452, 1472, FIG. 14).

The plurality of Doherty cells 340-347 are coupled in parallel between the carrier and peaking input signal manifolds 330, 350 and the output signal combiner manifold 370. The Doherty cells 340-347 are arranged side-by-side and directly adjacent to each other, where "adjacent" means positioned next to, and "directly adjacent" means positioned next to without significant electrical or non-electrical components or structures therebetween, other than isolation structures (e.g., shallow or deep trench isolation structures 467, FIG. 4). In some embodiments, the distance between adjacent Doherty cells 340-347 is less than the width of a transistor finger.

Referring to the enlarged Doherty cell 347 at the bottom of FIG. 3, each Doherty cell 340-347 includes parallel carrier and peaking transistor fingers 336, 356 and a phase shift element 380 (e.g., corresponding to carrier and peaking sub-amplifiers 236, 256 and phase shifter 280, FIG. 2). A carrier input 332 of each Doherty cell 340-347 is electrically coupled to the carrier input signal manifold 330, a peaking input 352 of each Doherty cell 340-347 is electrically coupled to the peaking input signal manifold 350, and the outputs (e.g., drain terminals) of both the carrier and peaking fingers 336, 356 are electrically coupled to the output signal combiner manifold 370.

As most clearly depicted in FIGS. 4 and 5, each transistor finger 336, 356 corresponds to a small FET that includes a gate terminal 337, 357 (or control terminal), a drain terminal 338, 358 (or first current-carrying terminal), and a source terminal (or second current-carrying terminal) 462, 463. For example, each transistor finger 336, 356 may be a metal-oxide-semiconductor FET (MOSFET), a laterally-diffused MOSFET (LDMOS FET), an enhancement-mode or depletion-mode high electron mobility transistor (HEMT), or another type of FET. According to various embodiments, each of the transistor fingers 336, 356 may be implemented, for example, using a silicon-based FET, a silicon-germanium (SiGe) based FET, or a III-V FET (e.g., a HEMT), such as a gallium nitride (GaN) FET (or another type of III-V transistor, including a gallium arsenide (GaAs) FET, a gallium phosphide (GaP) FET, an indium phosphide (InP) FET, or an indium antimonide (InSb) FET). In a specific embodiment, each transistor finger 336, 356 is a laterally-diffused metal oxide semiconductor (LDMOS) FET finger, which includes one or more active areas disposed between source and drain terminals.

Each transistor finger 336, 356 has an elongated active area in which a length of the finger or gate (i.e., a dimension extending along an axis between the input signal manifolds 330, 350 and the output signal manifold 370) is significantly larger than a width of the finger or gate (i.e., a dimension extending along an axis that is perpendicular to the length). For example, the finger/gate lengths may be in a range of about 50 microns to about 1200 microns, and the finger/gate widths may be in a range of about 0.1 microns to about 0.4 microns. In other embodiments, the finger lengths and widths may be smaller or larger than the above-given ranges. Each active area includes a plurality of elongated, parallel-aligned drain regions 438, 458 and source regions 460, 461 where each drain region 438, 458 and each source region 460, 461 is a doped semiconductor region formed in the base semiconductor substrate 410. A variably-conductive channel 437, 457 (and, in some embodiments, a drain drift region) is present between adjacent source and drain regions 438, 458, 460, 461.

Conductive (e.g., polysilicon or metal) gate terminals 337, 357 are formed in the build-up structure 412 over the top surface of the base semiconductor substrate 410. Each gate terminal 337, 357 extends over and along the length of a channel region 437, 457. Each gate terminal 337, 357 is electrically coupled (e.g., through conductive vias and patterned conductive layers in build-up structure 412) at multiple points along its length to elongated, conductive gate structures and "runners" 439, 459, which in turn are electrically coupled to the carrier input signal manifold 330 through the carrier input 332. Similarly, conductive (e.g., polysilicon) drain terminals 338, 358 are formed in the build-up structure 412 over the top surface of the base semiconductor substrate. Each drain terminal 338, 358 extends over and along the length of a drain region 438, 458. Finally, the source regions 460, 461 are electrically coupled to conductive (e.g., polysilicon or metal) source contacts 462, 463, which in turn are coupled to conductive TSVs (e.g., TSV 464, FIG. 4) that extend through the base semiconductor substrate (e.g., substrate 410) to connect with a conductive layer (e.g., layer 428) on the bottom surface of the base semiconductor substrate. In some embodiments, the source contacts 462, 463 between adjacent fingers 336, 356 may be replaced with a single source contact and TSV(s) (i.e., a shared electrical connection to the conductive layer 428 may be implemented between the source contacts 462, 463 of adjacent fingers 336, 356 within a cell). Either way, voltages applied to the gate terminals 337, 357 during operation modulate the conductivity of the variably-conductive channels 437, 457, thus enabling current flow between source and drain regions (or ultimately between conductive layer 428 and each drain terminal 338, 358).

Electromagnetic isolation features may be integrally-formed in die 301 to reduce or substantially eliminate electromagnetic coupling between the carrier and peaking fingers 336, 356 and/or between adjacent Doherty cells 340-347 during operation. For example, additional conductive features 465, 466 may be formed in the build-up structure 412 to provide electromagnetic shielding between carrier and peaking fingers 336, 356 and/or between adjacent Doherty cells 340-347. According to an embodiment, the additional conductive features 465, 466 may include additional conductive vias and conductive traces that are coupled to the source contacts 462, 463, and which extend upward from the source contacts 462, 463 toward or to the top surface 401 of the die 301. The additional conductive features 456, 466 may have heights that are substantially equal to or greater than the heights of the gate runners 439, 459, in some embodiments. During operation, electromagnetic energy that impinges upon the additional conductive features 465, 466 may be shunted to ground through the source contacts 462, 463. In addition or alternatively, to reduce or substantially eliminate electromagnetic coupling between the carrier and peaking fingers 336, 356 through the base semiconductor substrate 410, the electromagnetic isolation features may include shallow trench isolation (STI) and/or deep trench isolation (DTI) structures 467 formed in the base semiconductor substrate 410 between the carrier and peaking fingers 336, 356 and/or between adjacent Doherty cells 340-347. The STI or DTI structures 467 may include, for example, elongated trenches filled with dielectric material, and/or elongated doped semiconductor regions with high electrical isolation properties.

In the embodiment illustrated in FIGS. 3-5, in each transistor finger 336, 356, a source region 460, 461 is present on both sides of a single drain region 438, 458, and channels 437, 457 and associated gate structures 337, 357 also are present on both sides of each drain region 438, 458. Accordingly, each transistor finger 336, 356 essentially is symmetric about a central drain region 438, 458. During operation, current is drawn into each drain region 438, 458 from the two source regions 460, 461 (and through the channel regions 437, 457) on either side of each drain region 438, 458. In other embodiments, each transistor finger 336, 356 may include only a single source region and a single drain region, or may be otherwise configured.

The gate terminals 337 of each carrier finger 336 are coupled to the carrier input signal manifold 330 through a carrier input terminal 332 and a conductor (e.g., a transmission line). Similarly, the gate terminals 357 of each peaking finger 356 are coupled to the peaking input signal manifold 350 through a peaking input terminal 352 and a conductor (e.g., a transmission line).

The drain terminal 358 of each peaking finger 356 is closely electrically coupled to the output signal combiner manifold 370 (e.g., directly connected). Conversely, the drain terminal 338 of each carrier finger 336 is coupled to the output signal combiner manifold 370 through a phase shift element 380 (e.g., phase shifter 280, FIG. 2). More specifically, a first terminal or end 382 of the phase shift element 380 is coupled to the drain terminal 338 of the carrier finger 336, and a second terminal or end 384 of the phase shift element 380 is coupled to the output signal combiner manifold 370 (e.g., through a conductor, such as a transmission line).

The phase shift element 380 is configured to impart a predetermined phase delay to the amplified RF signal produced at the drain terminal 338 of carrier finger 336. According to an embodiment, the predetermined phase delay imparted by the phase shift element 380 may be about 90 degrees or less, in order to impart a total phase delay of about 90 degrees between the drain terminal 338 of the carrier finger and the output signal combiner manifold 370.

Figure 6:
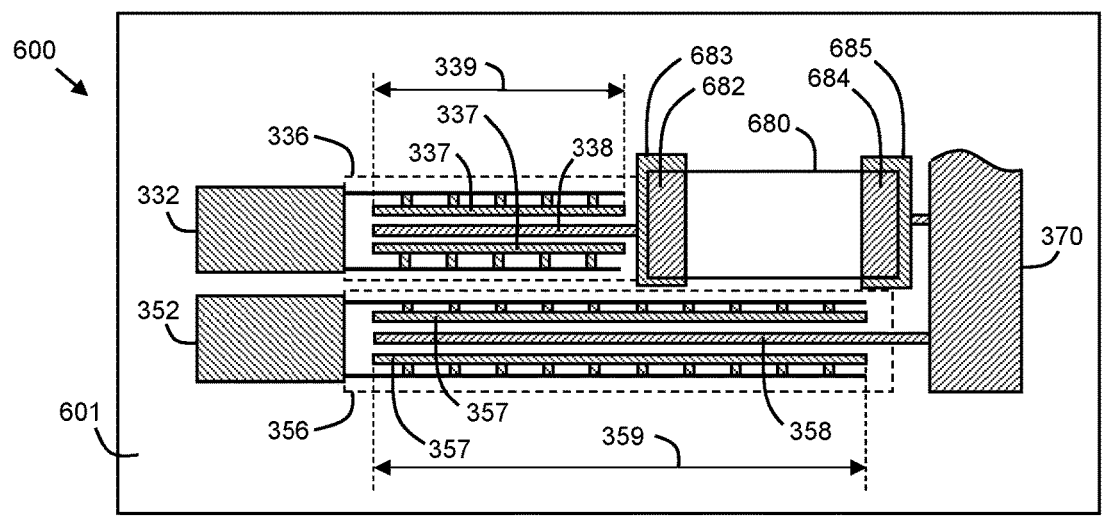
FIG. 6 is a top view of an asymmetric Doherty cell, in accordance with another example embodiment.

According to an embodiment, and as most clearly illustrated in FIGS. 3 and 5, the phase shift element 380 may be implemented using a spiral inductor that is integrally-formed in the die 301 using patterned portions of one or more conductive layers of the build-up structure 412. In other embodiments, and referring to FIG. 6, a Doherty cell 600 may include a phase shift element in the form of a chip inductor 680 (i.e., an inductor embodied in a discrete component) that is electrically and physically coupled to the top surface of the die 601 (i.e., the chip inductor 680 is integrated with die 601). More specifically, a first terminal 682 of the chip inductor 680 may be connected (e.g., soldered or connected with conductive adhesive) to a first bondpad 683, which is exposed at the top surface of the die and electrically connected to the drain terminal 338 of the carrier finger 336. A second terminal 684 of the chip inductor 680 may be connected (e.g., soldered or connected with conductive adhesive) to a second bondpad 685, which is exposed at the top surface of the die and electrically connected to the output signal combiner manifold 370 (e.g., through a conductor, such as a transmission line). In still other embodiments, the chip inductor 680 may be replaced with one or more wirebonds with first ends connected to the first bondpad 683 and second ends connected to the second bondpad 685. According to an embodiment, the inductance value of the phase shift element (e.g., an inductor) is in a range from about 0.1 nanohenry to about 20 nanohenries, although the inductance value may be smaller or larger, as well. Although FIG. 6 shows only one Doherty cell 600, multiple instances of Doherty cell 600 (e.g., from two to fifty cells 600) may be implemented side-by-side (as with Doherty cells 340-347, FIG. 3) on die 601, where the second bondpad 685 and the drain terminal 358 of each peaking finger 356 are coupled to a single output signal combiner manifold 370.

As illustrated in FIG. 3, the carrier and peaking fingers 336, 356 are directly adjacent to each other in each Doherty cell 340-347. Along the width of the output signal combiner manifold 370, this yields an alternating arrangement transistor fingers (i.e., the carrier finger of cell 340 is directly adjacent to the peaking finger of cell 340, which is directly adjacent to the carrier finger of cell 341, which is directly adjacent to the peaking finger of cell 341, which is directly adjacent to the carrier finger of cell 342, which is directly adjacent to the peaking finger of cell 342, and so on). In other embodiments, adjacent cells 340-347 may be "flipped" with respect to each other, so that the alternating arrangement of carrier and peaking fingers may have the same finger type (i.e., carrier or peaking fingers) directly adjacent to each other from one cell 340-347 to the next. In other words, this would yield a different alternating arrangement of transistor fingers (i.e., the carrier finger of cell 340 is directly adjacent to the peaking finger of cell 340, which is directly adjacent to the peaking finger of cell 341, which is directly adjacent to the carrier finger of cell 341, which is directly adjacent to the carrier finger of cell 342, which is directly adjacent to the peaking finger of cell 342, and so on).

Each of the Doherty cells 340-347 is an asymmetric Doherty cell, in that the sizes (or peripheries) of the carrier and peaking fingers 336, 356 are different. More specifically, in the embodiment illustrated in FIG. 3, the length 339 of the carrier finger 336 is about half the length 359 of the peaking finger 356 (or conversely, the length 359 of the peaking finger 356 is about twice the length 339 of the carrier finger 336). Accordingly, the periphery (and current carrying capacity) of the carrier finger 336 is about half the periphery (and current carrying capacity) of the peaking finger 356 (or conversely, the periphery of the peaking finger 356 is about twice the periphery of the carrier finger 336). Thus, the carrier-to-peaking amplifier size ratio of each of the Doherty cells 340-347 is about 1:2, and the carrier-to-peaking ratio of the overall Doherty IC 300 also is about 1:2. In other embodiments, larger or smaller asymmetry ratios may be implemented by adjusting the relative lengths of the carrier and peaking fingers 336, 356.

Each of the Doherty cells 340-347 has a relatively compact arrangement. More specifically, and as is illustrated in FIG. 3, the carrier and peaking fingers 336, 356 have input ends that are aligned along a first line 390 that is perpendicular to the lengths 339, 359 of the carrier and peaking fingers 336, 356, the peaking finger 359 has an output end that is aligned along a second line 391 that is perpendicular to the lengths 339, 359 of the carrier and peaking fingers 336, 356, and the phase shift element 380 is positioned between the output end of the carrier finger 336 and the second line 391.

Figure 7:
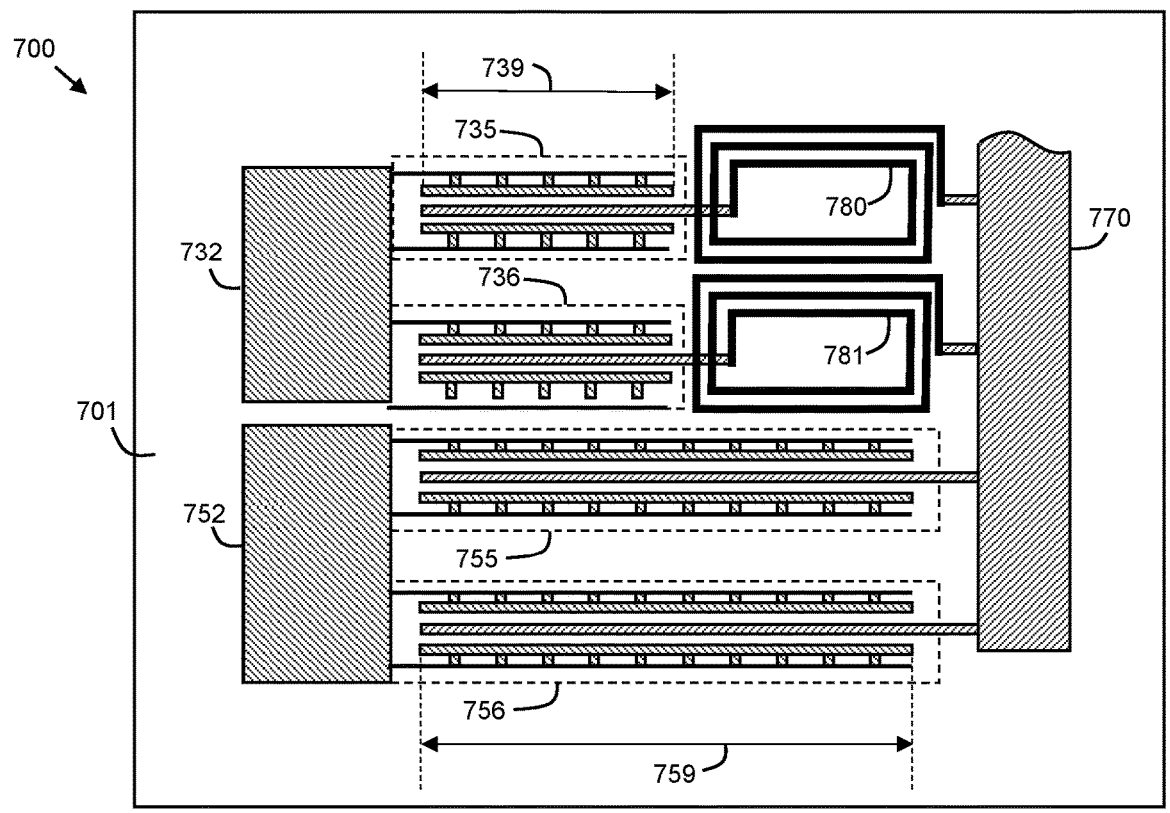
FIG. 7 is a top view of an asymmetric Doherty cell, in accordance with yet another example embodiment.

In other embodiments, an asymmetric Doherty cell may be achieved by including multiple carrier and peaking fingers in each Doherty cell. For example, FIG. 7 is a top view of an asymmetric Doherty cell 700, in accordance with another example embodiment. Doherty cell 700 includes two carrier transistor fingers 735, 736, two peaking transistor fingers 755, 756, and two phase shift elements 780, 781 integrally-formed with die 701.

On the input side of Doherty cell 700, the gate terminals of carrier fingers 735, 736 (which are directly adjacent to each other) are coupled to a carrier input terminal 732, which in turn would be coupled to a carrier input signal manifold (e.g., manifold 330, FIG. 3). Similarly, the gate terminals of peaking fingers 755, 756 (which are directly adjacent to each other) are coupled to a peaking input terminal 752, which in turn would be coupled to a peaking input signal manifold (e.g., manifold 350, FIG. 3). The drain terminal of each peaking finger 755, 756 is closely electrically coupled to an output signal combiner manifold 770 (e.g., manifold 370, FIG. 3). Conversely, the drain terminal of each carrier finger 735, 736 is coupled to the output signal combiner manifold 770 (e.g., manifold 370, FIG. 3) through a phase shift element 780, 781 (e.g., phase shifter 280, FIG. 2). More specifically, a first terminal or end of the phase shift element 780 is coupled to the drain terminal of the carrier finger 735, and a second terminal or end of the phase shift element 780 is coupled to the output signal combiner manifold 770. Similarly, a first terminal or end of the phase shift element 781 is coupled to the drain terminal of the carrier finger 736, and a second terminal or end of the phase shift element 781 is coupled to the output signal combiner manifold 770. In the illustrated embodiment, each phase shift element 780, 781 includes an integrally-formed spiral inductor. In other embodiments, the phase shift elements 780, 781 may be replaced with chip inductors (e.g., chip inductor 680, FIG. 6) or with wirebonds.

Each phase shift element 780, 781 is configured to impart a predetermined phase delay to the amplified RF signals produced at one of the drain terminals of carrier fingers 735, 736. According to an embodiment, the predetermined phase delay imparted by each phase shift element 780, 781 may be about 90 degrees or less, in order to impart a total phase delay of about 90 degrees between the drain terminal of each carrier finger and the output signal combiner manifold 770.

Similar to Doherty cell 347 (FIG. 3), the lengths 739 and peripheries of the carrier fingers 735, 736 are different from the lengths 759 and peripheries of the peaking fingers 755, 756. Again, the total periphery of the peaking fingers 755, 756 (i.e., the sum of the peripheries of fingers 755, 756) is about twice the total periphery of the carrier fingers 735, 736 (i.e., the sum of the peripheries of fingers 735, 736). Accordingly, the carrier-to-peaking amplifier size ratio of Doherty cell 700 is about 1:2. In other embodiments, larger or smaller asymmetry ratios may be implemented by adjusting the relative lengths of the carrier and peaking fingers 735, 736, 755, 756. In addition, larger or smaller asymmetry ratios (e.g., 1:3, 1:4, 1:1.5, and so on) may be implemented by including different numbers of carrier and peaking fingers (e.g., other embodiments may include more or fewer than two carrier fingers 735, 736 and/or more or fewer than two peaking fingers 755, 756).

Referring again briefly to FIG. 3, each of Doherty cells 340-347 may be replaced with an instance Doherty cell 700 to produce a Doherty IC that includes a plurality of Doherty cells 700 electrically connected in parallel between the carrier and peaking input signal manifolds 330, 350 and the output signal combiner manifold 370. More specifically, the carrier input 732 of each instance of Doherty cell 700 would be electrically coupled to the carrier input signal manifold 330, the peaking input 752 of each instance of Doherty cell 700 would be electrically coupled to the peaking input signal manifold 350, and the outputs (e.g., drain terminals) of each of the carrier and peaking fingers 735, 736, 755, 756 would be electrically coupled to the output signal combiner manifold 370. In other words, although FIG. 7 shows only one Doherty cell 700, multiple instances of Doherty cell 700 (e.g., from two to fifty cells 700) may be implemented side-by-side (as with Doherty cells 340-347, FIG. 3) on die 701, where the phase shifters 780, 781 and the drain terminal of each peaking cell 755, 756 are coupled to a single output signal combiner manifold 770.

Figure 8:
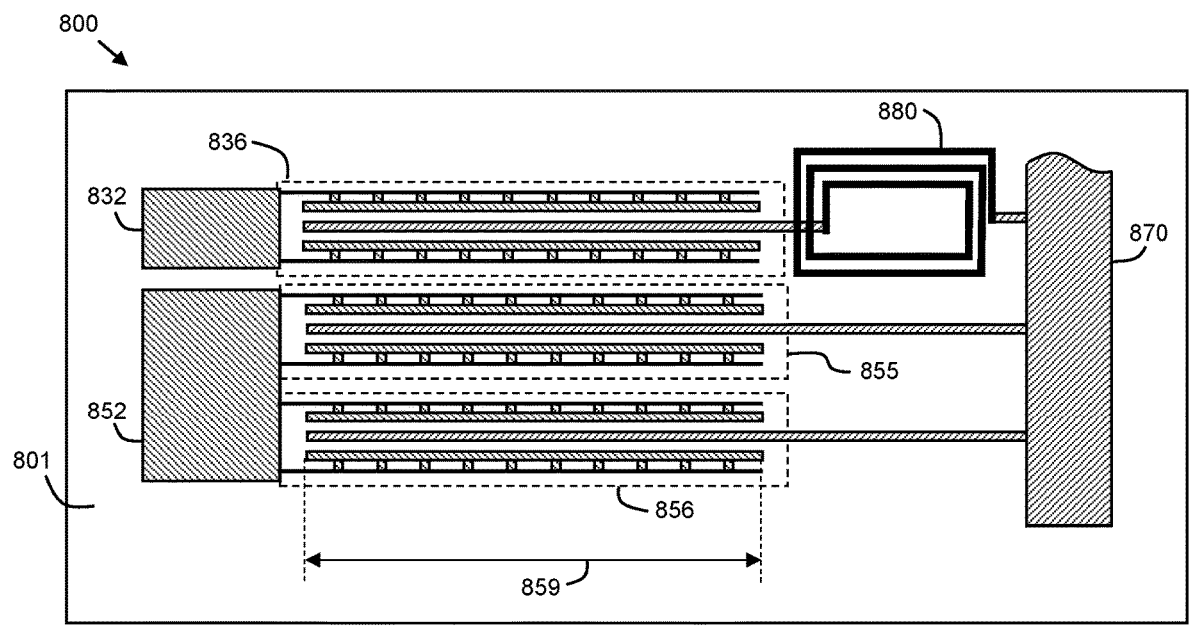
FIG. 8 is a top view of an asymmetric Doherty cell, in accordance with another example embodiment.

In still other embodiments, an asymmetric Doherty cell may be achieved by including different numbers of equal-length carrier and peaking fingers in each Doherty cell. For example, FIG. 8 is a top view of an asymmetric Doherty cell 800, in accordance with another example embodiment. Doherty cell 800 includes one carrier transistor finger 836, two peaking transistor fingers 855, 856, and a phase shift element 880.

On the input side of Doherty cell 800, the gate terminal of carrier finger 836 is coupled to a carrier input terminal 832, which in turn would be coupled to a carrier input signal manifold (e.g., manifold 330, FIG. 3). Similarly, the gate terminals of both peaking fingers 855, 856 are coupled to a peaking input terminal 852, which in turn would be coupled to a peaking input signal manifold (e.g., manifold 350, FIG. 3). The drain terminal of each peaking finger 855, 856 is closely electrically coupled to an output signal combiner manifold 870 (e.g., manifold 370, FIG. 3). Conversely, the drain terminal of carrier finger 836 is coupled to the output signal combiner manifold 870 (e.g., manifold 370, FIG. 3) through a phase shift element 880 (e.g., phase shifter 280, FIG. 2). More specifically, a first terminal or end of the phase shift element 880 is coupled to the drain terminal of the carrier finger 836, and a second terminal or end of the phase shift element 880 is coupled to the output signal combiner manifold 870 (e.g., through a conductor, such as a transmission line). In the illustrated embodiment, phase shift element 880 includes an integrally-formed spiral inductor. In other embodiments, the phase shift element 880 may be replaced with a chip inductor (e.g., chip inductor 680, FIG. 6) or with wirebonds.

Again, the phase shift element 880 is configured to impart a predetermined phase delay to the amplified RF signal produced at the drain terminal of carrier finger 836. According to an embodiment, the predetermined phase delay imparted by the phase shift element 880 may be about 90 degrees or less, in order to impart a total phase delay of about 90 degrees between the drain terminal of the carrier finger and the output signal combiner manifold 870.

In contrast with Doherty cell 347 (FIG. 3), the lengths 859 and peripheries of each of the carrier and peaking fingers 836, 855, 856 are substantially equal (i.e., within about 5 percent of each other). However, because one carrier finger 836 and two peaking fingers 855, 856 are implemented, the total periphery of the peaking fingers 855, 856 is about twice the periphery of the carrier finger 836. Accordingly, the carrier-to-peaking amplifier size ratio of Doherty cell 800 is about 1:2. In other embodiments, larger or smaller asymmetry ratios may be implemented by adjusting the numbers of the carrier and peaking fingers 836, 855, 856. Generally, a Doherty cell may haven carrier fingers (n≥1) and m peaking fingers (m≥1), all of equal length (periphery), and as long as n≠m, an asymmetry ratio may be achieved. Of course, when n=m, the Doherty cell would be a symmetric Doherty cell, as long as the carrier and peaking fingers have equal length (and periphery).

Although FIG. 8 shows only one Doherty cell 800, multiple instances of Doherty cell 800 (e.g., from two to fifty cells 800) may be implemented side-by-side (as with Doherty cells 340-347, FIG. 3) on die 801, where each phase shifter 880 and the drain terminal of each peaking cell 855, 856 are coupled to a single output signal combiner manifold 870.

As indicated above, in various embodiments, a Doherty cell may have n carrier fingers (n≥1) and m peaking fingers (m≥1) of equal or unequal lengths (periphery). Further, although the various embodiments discussed above include asymmetric Doherty cells, other embodiments may include symmetric Doherty cells. In a symmetric Doherty cell, the total periphery of the carrier finger(s) in a cell is substantially equal to the total periphery of the peaking finger(s) in a cell.

Figure 9:
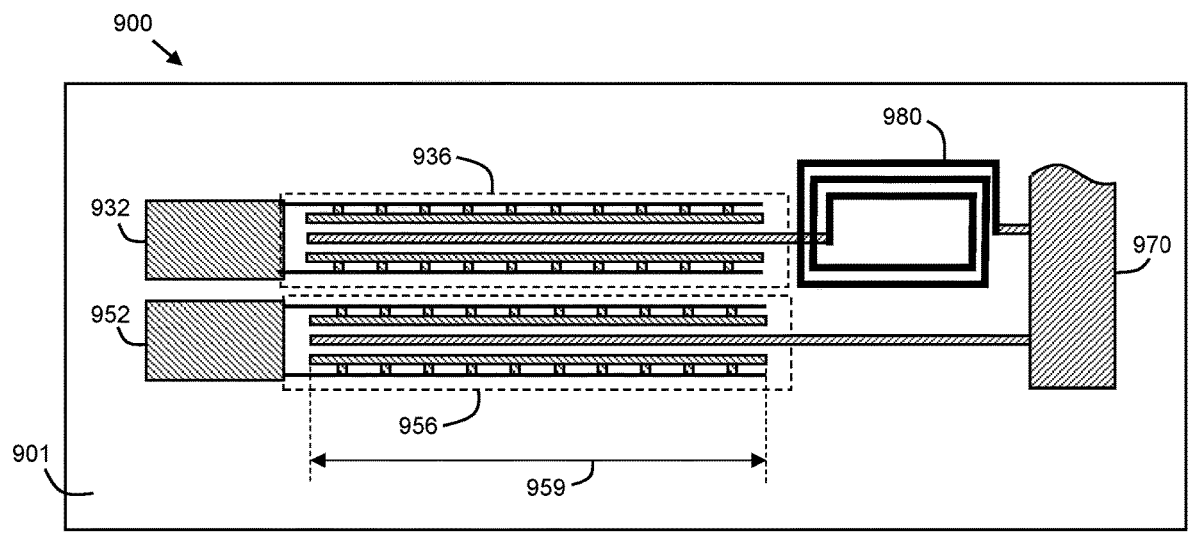
FIG. 9 is a top view of a symmetric Doherty cell, in accordance with an example embodiment.

For example, FIG. 9 is a top view of a symmetric Doherty cell 900, in accordance with an example embodiment. Doherty cell 900 includes one carrier transistor finger 936, one peaking transistor finger 956, and a phase shift element 980.

On the input side of Doherty cell 900, the gate terminal of carrier finger 936 is coupled to a carrier input terminal 932, which in turn would be coupled to a carrier input signal manifold (e.g., manifold 330, FIG. 3). Similarly, the gate terminal of peaking finger 956 is coupled to a peaking input terminal 952, which in turn would be coupled to a peaking input signal manifold (e.g., manifold 350, FIG. 3). The drain terminal of peaking finger 956 is closely electrically coupled to an output signal combiner manifold 970 (e.g., manifold 370, FIG. 3). Conversely, the drain terminal of carrier finger 936 is coupled to the output signal combiner manifold 970 (e.g., manifold 370, FIG. 3) through a phase shift element 980 (e.g., phase shifter 280, FIG. 2). More specifically, a first terminal or end of the phase shift element 980 is coupled to the drain terminal of the carrier finger 936, and a second terminal or end of the phase shift element 980 is coupled to the output signal combiner manifold 970 (e.g., through a conductor, such as a transmission line). In the illustrated embodiment, phase shift element 980 includes an integrally-formed spiral inductor. In other embodiments, the phase shift element 980 may be replaced with a chip inductor (e.g., chip inductor 680, FIG. 6) or with wirebonds.

Again, the phase shift element 980 is configured to impart a predetermined phase delay to the amplified RF signal produced at the drain terminal of carrier finger 936. According to an embodiment, the predetermined phase delay imparted by the phase shift element 980 may be about 90 degrees or less, in order to impart a total phase delay of about 90 degrees between the drain terminal of the carrier finger and the output signal combiner manifold 970.

Similar to Doherty cell 800 (FIG. 8), the lengths 959 and peripheries of each of the carrier and peaking fingers 936, 956 are substantially equal (i.e., within about 5 percent of each other). In addition, because one carrier finger 936 and one peaking finger 956 is implemented, the periphery of the peaking finger 956 is about equal to the periphery of the carrier finger 936. Accordingly, the carrier-to-peaking amplifier size ratio of Doherty cell 900 is about 1:1, and the Doherty cell 900 is symmetric.

Although FIG. 9 shows only one Doherty cell 900, multiple instances of Doherty cell 900 (e.g., from two to fifty cells 900) may be implemented side-by-side (as with Doherty cells 340-347, FIG. 3) on die 901, where each phase shifter 980 and the drain terminal of each peaking cell 956 are coupled to a single output signal combiner manifold 970.

Figure 10:
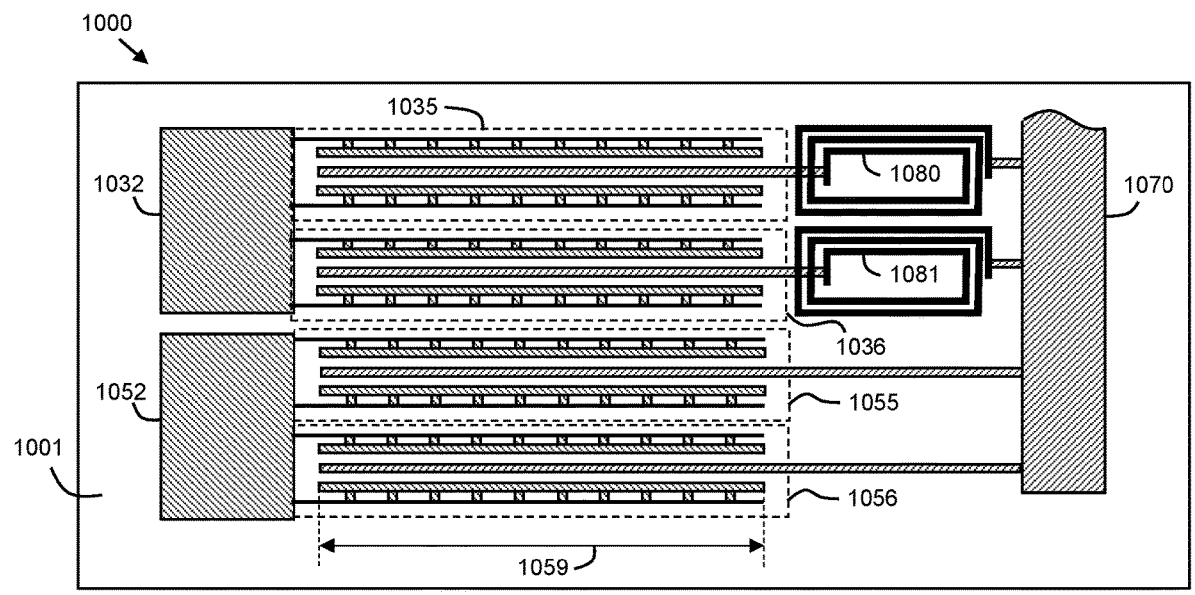
FIG. 10 is a top view of a symmetric Doherty cell, in accordance with another example embodiment.

In the embodiment of FIG. 9, a symmetric Doherty cell 900 includes a single carrier finger 936 and a single peaking finger 956, where the carrier and peaking fingers 936, 956 are of equal length. In other embodiments, a symmetric Doherty cell may include multiple, equal-length carrier and peaking fingers. For example, FIG. 10 is a top view of a symmetric Doherty cell 1000, in accordance with another example embodiment, which includes an equal number of equal-length carrier and peaking fingers 1035, 1036, 1055, 1056. More specifically, Doherty cell 1000 includes two carrier transistor fingers 1035, 1036, two peaking transistor fingers 1055, 1056, and two phase shift elements 1080, 1081.

On the input side of Doherty cell 1000, the gate terminal of each carrier finger 1035, 1036 is coupled to a carrier input terminal 1032, which in turn would be coupled to a carrier input signal manifold (e.g., manifold 330, FIG. 3). Similarly, the gate terminal of each peaking finger 1055, 1056 is coupled to a peaking input terminal 1052, which in turn would be coupled to a peaking input signal manifold (e.g., manifold 350, FIG. 3). The drain terminal of each peaking finger 1055, 1056 is closely electrically coupled to an output signal combiner manifold 1070 (e.g., manifold 370, FIG. 3). Conversely, the drain terminal of each carrier finger 1035, 1036 is coupled to the output signal combiner manifold 1070 (e.g., manifold 370, FIG. 3) through a phase shift element 1080, 1081 (e.g., phase shifter 280, FIG. 2). More specifically, a first terminal or end of each phase shift element 1080, 1081 is coupled to the drain terminal of a carrier finger 1035, 1036, and a second terminal or end of each phase shift element 1080, 1081 is coupled to the output signal combiner manifold 1070 (e.g., through a conductor, such as a transmission line). In the illustrated embodiment, each phase shift element 1080, 1081 includes an integrally-formed spiral inductor. In other embodiments, the phase shift elements 1080, 1081 may be replaced with chip inductors (e.g., chip inductor 680, FIG. 6) or with wirebonds.

Again, each phase shift element 1080, 1081 is configured to impart a predetermined phase delay to the amplified RF signal produced at the drain terminal of each carrier finger 1035, 1036. According to an embodiment, the predetermined phase delay imparted by each phase shift element 1080, 1081 may be about 90 degrees or less, in order to impart a total phase delay of about 90 degrees between the drain terminal of each carrier finger and the output signal combiner manifold 1070.

Similar to Doherty cells 800, 900 (FIGS. 8, 9), the lengths 1059 and peripheries of each of the carrier and peaking fingers 1035, 1036, 1055, 1056 are substantially equal (i.e., within about 5 percent of each other). In addition, because an equal number of carrier fingers 1035, 1036 and peaking fingers 1055, 1056 are implemented, the total periphery of the peaking fingers 1055, 1056 is about equal to the total periphery of the carrier fingers 1035, 1036. Accordingly, the carrier-to-peaking amplifier size ratio of Doherty cell 1000 is about 1:1, and the Doherty cell 1000 is symmetric.

Although Doherty cell 1000 includes two carrier fingers 1035, 1036 and two peaking fingers 1055, 1056, in other embodiments, more than two equal-length carrier fingers and more than two peaking fingers may be implemented in a symmetric cell. For example, a Doherty cell may have n carrier fingers (n≥1) and m peaking fingers (m≥1), all of equal length (periphery), and as long as n=m, a symmetric Doherty cell may be achieved.

Further, although FIG. 10 shows only one Doherty cell 1000, multiple instances of Doherty cell 1000 (e.g., from two to fifty cells 1000) may be implemented side-by-side (as with Doherty cells 340-347, FIG. 3) on die 1001, where the phase shifters 1080, 1081 and the drain terminal of each peaking cell 1055, 1056 are coupled to a single output signal combiner manifold 1070.

Figure 11:
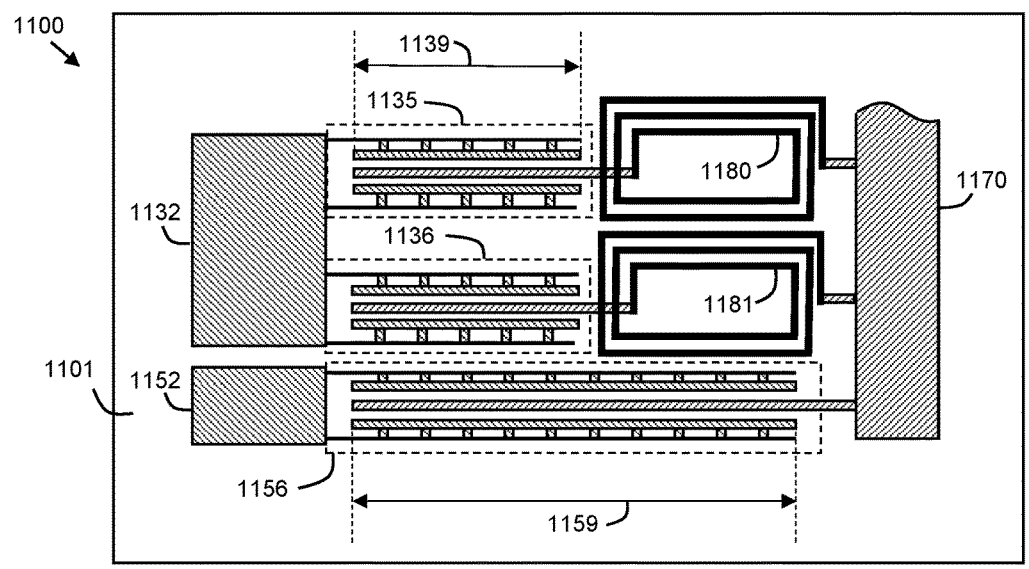
FIG. 11 is a top view of a symmetric Doherty cell, in accordance with yet another example embodiment.

The embodiments of symmetric Doherty cells 900, 1000 of FIGS. 9 and 10 are achieved using equal-length carrier and peaking fingers 936, 956, 1035, 1036, 1055, 1056. In other embodiments, a symmetric Doherty cell may be achieved using carrier and peaking fingers having different lengths. For example, FIG. 11 is a top view of a symmetric Doherty cell 1100, in accordance with yet another example embodiment, which includes an unequal number of different-length carrier and peaking fingers 1135, 1136, 1156. More specifically, Doherty cell 1100 includes two carrier transistor fingers 1135, 1136, one peaking transistor finger 1156, and two phase shift elements 1180, 1181.

On the input side of Doherty cell 1100, the gate terminal of each carrier finger 1135, 1136 is coupled to a carrier input terminal 1132, which in turn would be coupled to a carrier input signal manifold (e.g., manifold 330, FIG. 3). Similarly, the gate terminal of the peaking finger 1156 is coupled to a peaking input terminal 1152, which in turn would be coupled to a peaking input signal manifold (e.g., manifold 350, FIG. 3). The drain terminal of the peaking finger 1156 is closely electrically coupled to an output signal combiner manifold 1170 (e.g., manifold 370, FIG. 3). Conversely, the drain terminal of each carrier finger 1135, 1136 is coupled to the output signal combiner manifold 1170 (e.g., manifold 370, FIG. 3) through a phase shift element 1180, 1181 (e.g., phase shifter 280, FIG. 2). More specifically, a first terminal or end of each phase shift element 1180, 1181 is coupled to the drain terminal of a carrier finger 1135, 1136, and a second terminal or end of each phase shift element 1180, 1181 is coupled to the output signal combiner manifold 1170 (e.g., through a conductor, such as a transmission line). In the illustrated embodiment, each phase shift element 1180, 1181 includes an integrally-formed spiral inductor. In other embodiments, the phase shift elements 1180, 1181 may be replaced with chip inductors (e.g., chip inductor 680, FIG. 6) or with wirebonds.

Again, each phase shift element 1180, 1181 is configured to impart a predetermined phase delay to the amplified RF signal produced at the drain terminal of each carrier finger 1135, 1136. According to an embodiment, the predetermined phase delay imparted by each phase shift element 1180, 1181 may be about 90 degrees or less, in order to impart a total phase delay of about 90 degrees between the drain terminal of each carrier finger and the output signal combiner manifold 1170.

Similar to Doherty cells 300, 700 (FIGS. 3, 6, 7), the lengths 1139, 1159 of the carrier and peaking fingers 1135, 1136, 1156 are unequal. More specifically, in the embodiment illustrated in FIG. 11, the length 1139 of the carrier fingers 1135, 1136 is about half the length 1159 of the peaking finger 1156 (or conversely, the length 1159 of the peaking finger 1156 is about twice the length 1139 of the carrier fingers 1135, 1136). However, because two carrier fingers 1135, 1136 and one peaking finger 1156 are implemented, the periphery of the peaking finger 1156 is about equal to the total periphery of the carrier fingers 1135, 1136. Accordingly, the carrier-to-peaking amplifier size ratio of Doherty cell 1100 is about 1:1, and the Doherty cell 1100 is symmetric.

Although Doherty cell 1000 includes two carrier fingers 1135, 1136 and one peaking finger 1156, in other embodiments, more than two carrier fingers and/or more than one peaking finger may be implemented in a symmetric cell with unequal-length carrier and peaking fingers.

Further, although FIG. 11 shows only one Doherty cell 1100, multiple instances of Doherty cell 1100 (e.g., from two to fifty cells 1100) may be implemented side-by-side (as with Doherty cells 340-347, FIG. 3) on die 1101, where the phase shifters 1180, 1181 and the drain terminal of the peaking cell 1156 are coupled to a single output signal combiner manifold 1170.

Each of the Doherty amplifier ICs and Doherty cells illustrated in FIGS. 2-11 and described above correspond to two-way Doherty amplifiers or two-way Doherty cells that include one carrier amplifier (consisting of one or more carrier fingers) and one peaking amplifier (consisting of one or more peaking fingers) coupled between carrier and peaking input terminals, respectively, and a combining structure (e.g., an output signal combining manifold). Other embodiments may include "N-way" Doherty power amplifiers, where N>2, and which include one carrier amplifier and N−1 peaking amplifiers.

Figure 12:
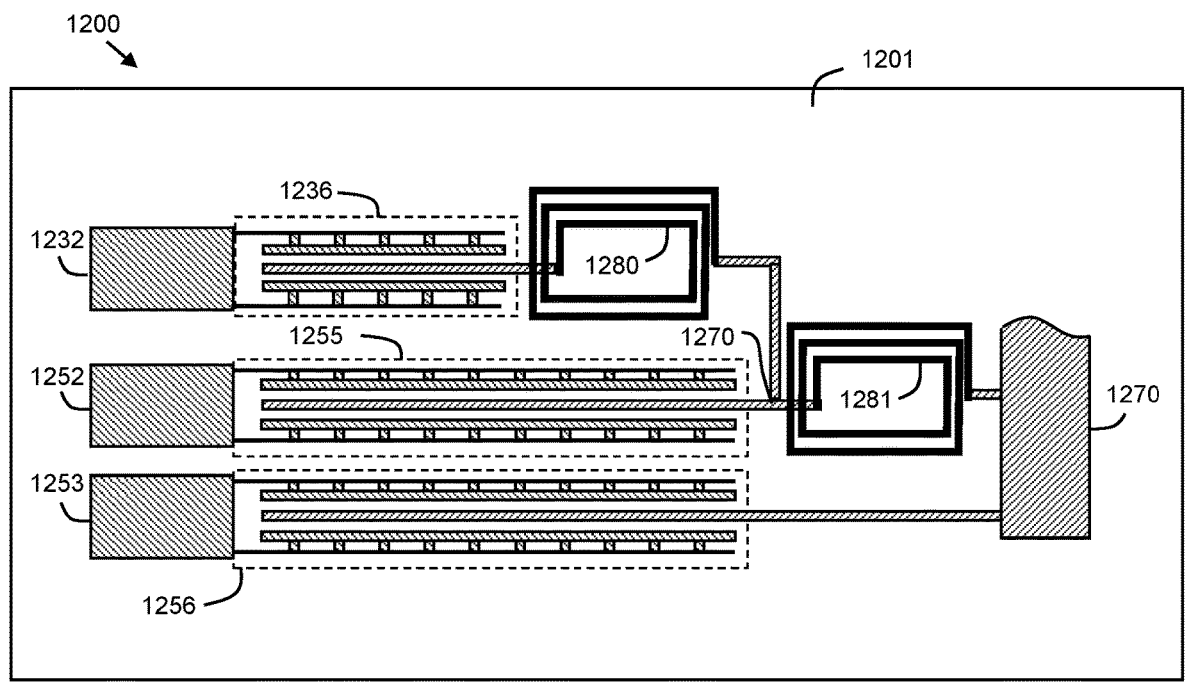
FIG. 12 is a top view of a three-way Doherty cell, in accordance with another example embodiment.

For example, FIG. 12 is a top view of a three-way Doherty cell 1200, in accordance with another example embodiment. Essentially, three-way Doherty cell 1200 includes one carrier sub-amplifier (in the form of carrier finger 1236) and two peaking sub-amplifiers (in the form of peaking fingers 1255, 1256).

On the input side of three-way Doherty cell 1200, the gate terminal of carrier finger 1236 is coupled to a carrier input terminal 1232, which in turn would be coupled to a carrier input signal manifold (not illustrated). The gate terminal of the first peaking finger 1255 is coupled to a first peaking input terminal 1252, which in turn would be coupled to a first peaking input signal manifold (not illustrated). Finally, the gate terminal of the second peaking finger 1256 is coupled to a second peaking input terminal 1253, which in turn would be coupled to a second peaking input signal manifold (not illustrated). Each of the carrier input signal manifold, the first peaking input signal manifold, and the second peaking input signal manifold (not illustrated) are electrically isolated from each other on the input side of die 1201, and each input signal manifold would receive a portion of the signal energy of an input RF signal from a three-way signal divider (e.g., an embodiment of divider 210, FIG. 2, that divides the signal energy of an input RF signal into three portions).

On the output side of Doherty cell 1200, the drain terminal of peaking finger 1256 is closely electrically coupled to an output signal combiner manifold 1270, and the drain terminal of peaking finger 1255 is coupled to the output signal combiner manifold 1270 through a phase shift element 1281. More specifically, a first terminal or end of phase shift element 1281 is coupled to the drain terminal of peaking finger 1255, and a second terminal or end of phase shift element 1281 is coupled to the output signal combiner manifold 1270 (e.g., through a conductor, such as a transmission line). The drain terminal of carrier finger 1236 is electrically coupled through phase shift element 1280 to a node 1270 between the drain terminal of peaking finger 1255 and phase shift element 1281.

According to an embodiment, node 1270 functions as a first combining node at which the signal energy from carrier finger 1236 and peaking finger 1255 are combined. After the combined signal energy from carrier finger 1236 and peaking finger 1255 are phase shifted through phase shift element 1281, the output signal combiner manifold 1270 functions as a second combining node at which the signal energy from peaking finger 1256 is combined with the phase-shifted, combined signal energy from carrier finger 1236 and peaking finger 1255.

In the illustrated embodiment, each phase shift element 1280, 1281 includes an integrally-formed spiral inductor. In other embodiments, the phase shift elements 1280, 1281 may be replaced with chip inductors (e.g., chip inductor 680, FIG. 6) or with wirebonds. Again, each phase shift element 1280, 1281 is configured to impart a predetermined phase delay to the RF signal conveyed through the phase shift element 1280, 1281. According to an embodiment, the predetermined phase delay imparted by each phase shift element 1280, 1281 may be about 90 degrees or less.

Although FIG. 12 shows only one Doherty cell 1200, multiple instances of Doherty cell 1200 (e.g., from two to fifty cells 1200) may be implemented side-by-side (as with Doherty cells 340-347, FIG. 3) on die 1201, where the phase shifter 1281 and the drain terminal of the peaking cell 1256 are coupled to a single output signal combiner manifold 1270.

The various embodiments described in detail in conjunction with FIGS. 1-12 correspond to "non-inverted" Doherty amplifiers in which about a 90-degree phase delay is implemented between the output of the carrier amplifier (or each carrier finger) and the combining node (e.g., output signal combiner manifold 370, 770, 870, 970, 1070, 1170, FIGS. 3 and 6-11), and no significant phase delay is implemented between the output of the peaking amplifier (or each peaking finger) and the combining node. In other embodiments, the inventive subject matter could be included within an "inverted" Doherty amplifier in which about a 90-degree phase delay is implemented between the output of the peaking amplifier (or each peaking finger) and the combining node, and no significant phase delay is implemented between the output of the carrier amplifier (or each carrier finger) and the combining node. Further, the inventive subject matter may be implemented in multi-path amplifiers other than Doherty power amplifiers. Accordingly, and particularly in the claims, a "first amplifier" may mean a carrier amplifier, a peaking amplifier, or another type of amplifier, and a "second amplifier" may mean a peaking amplifier, a carrier amplifier, or yet another type of amplifier. Similarly, references to a "first amplifier finger" or a "first sub-amplifier" may apply to a carrier finger or sub-amplifier, a peaking finger or sub-amplifier, or another type of amplifier finger or sub-amplifier, and references to a "second amplifier finger" or a "second sub-amplifier" may apply to a peaking finger or sub-amplifier, a carrier finger or sub-amplifier, or yet another type of amplifier finger or sub-amplifier.

Other modifications also may be implemented. For example, as was most clearly illustrated in FIGS. 4 and 5, the source regions (e.g., source regions 460, 461, FIGS. 4, 5) of the carrier and peaking fingers may be coupled to a ground reference node (e.g., conductive layer 428, FIGS. 4, 5) that is physically located at a bottom surface (e.g., surface 402, FIGS. 4, 5) of an amplifier die (e.g., any of dies 301, 601, 701, 801, 901, 1001, 1101, 1201, FIGS. 3-12). As described previously, in such embodiments, the bottom-located ground reference node may be coupled to a ground node of a package substrate (e.g., flange 1420, FIG. 14). In alternate embodiments, the source regions of the carrier and peaking fingers may be coupled to one or more ground reference nodes that are exposed at the top surface of the die. In such embodiments, the top-located ground reference node(s) may be coupled to system ground through wirebonds, or the die may be flip-chip mounted to a package substrate (i.e., mounted with the die top surface in contact with the top surface of the package substrate).

Figure 13:
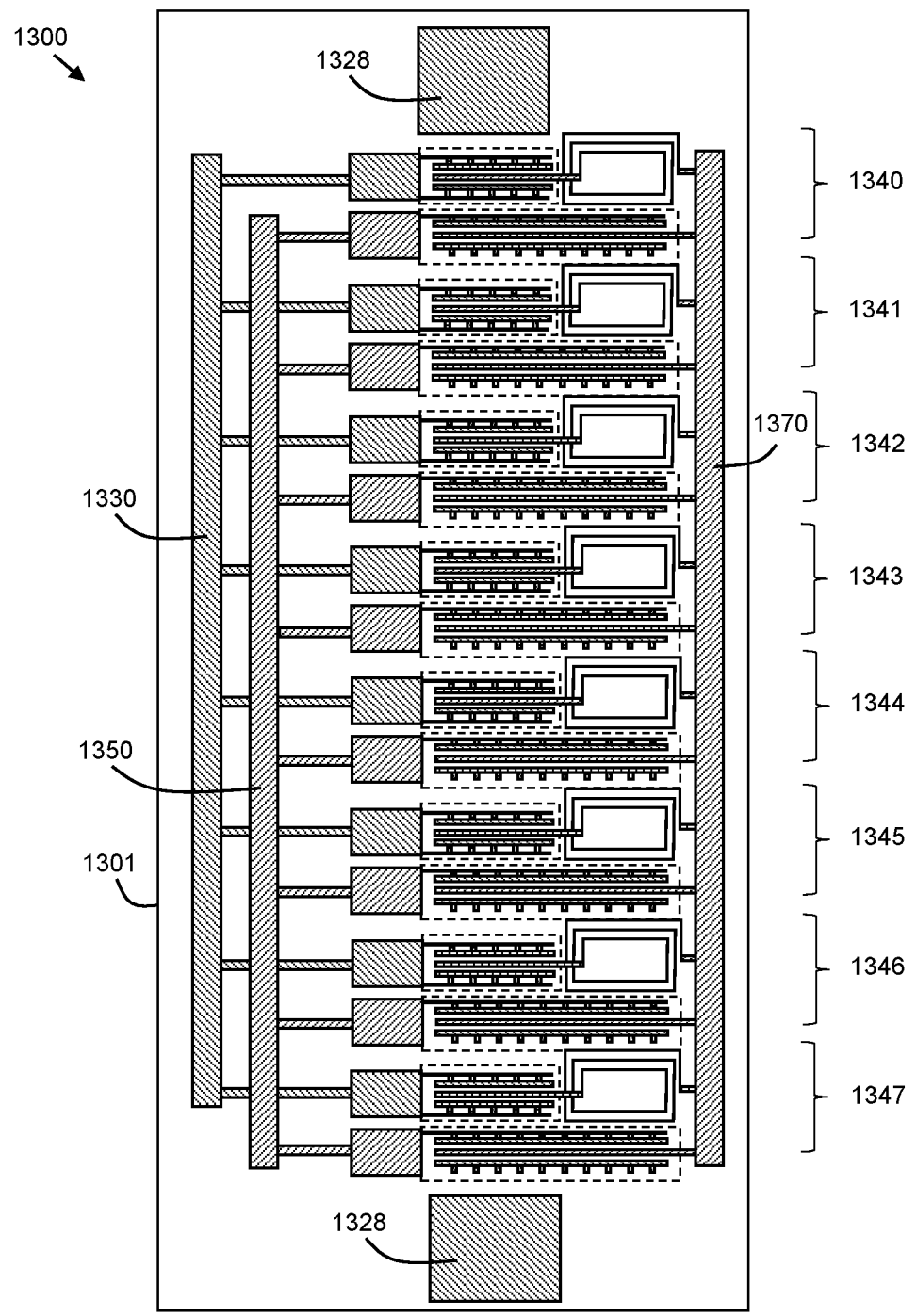
FIG. 13 is a top view of an asymmetric power amplifier IC with top source contacts, in accordance with an example embodiment.

For example, FIG. 13 is a top view of a power amplifier IC 1300 with top source contacts 1328, in accordance with an example embodiment. Power amplifier IC 1300 is substantially similar to power amplifier IC 300 (FIG. 3), in that power amplifier IC 1300 includes a plurality of Doherty amplifier cells 1340, 1341, 1342, 1343, 1344, 1345, 1346, 1347 electrically coupled between carrier and peaking input signal manifolds 1330, 1350 and an output signal combiner manifold 1370. Although the Doherty amplifier cells 1340-1347 in FIG. 13 appear to be substantially similar to Doherty amplifier cells 340-347 in FIGS. 3-5, Doherty amplifier cells 1340-1347 may be replaced with many of the other, previously-described Doherty amplifier cell embodiments (e.g., cells 700, 800, 900, 1000, 1100, 1200, FIGS. 7-12).

A significant difference between power amplifier IC 1300 and the previously-described embodiments is that the source regions (e.g., source regions 460, 461, FIGS. 4, 5) of each of the transistor fingers of IC 1300 are electrically coupled to top source contacts 1328, rather than being electrically coupled to a ground reference node located at the bottom surface of the die (e.g., to conductive layer 428, FIGS. 4, 5). According to an embodiment, the top source contacts 1328 include conductive bondpads that are exposed at the top surface of die 1301, and the top source contacts 1328 are electrically coupled to the source regions through patterned conductive layers and conductive vias in the die build-up structure (e.g., build-up structure 412, FIGS. 4, 5).

According to an embodiment, the top source contacts 1328 may be configured to be physically and electrically connected (e.g., soldered or conductively adhered) to corresponding conductive pads at the top surface of a system substrate (e.g., a PCB). Alternatively, the top source contacts 1328 may be configured for attachment of wirebonds. Although FIG. 13 shows two top source contacts 1328 located on both sides of the Doherty cells 1340-1347, in other embodiments, more or fewer source contacts 1328 may be implemented, and/or the source contacts 1328 may be located in other positions at the top surface of the die.

As indicated above, power amplifier ICs, and more specifically any of amplifier dies 301, 601, 701, 801, 901, 1001, 1101, 1201, 1301 (FIGS. 3-13) may be packaged and/or incorporated into a larger electrical system in a variety of ways. For example, the above-described amplifier dies may be packaged within an overmolded or air-cavity power device package. Alternatively, the above-described amplifier dies may be packaged in a surface-mount type of package, such as a no-leads package (e.g., a dual-flat no leads (DFN) or quad-flat no leads (QFN) package). In still other embodiments, the above-described amplifier dies may be mounted directly to a module or PCB substrate surface.

Figure 14:
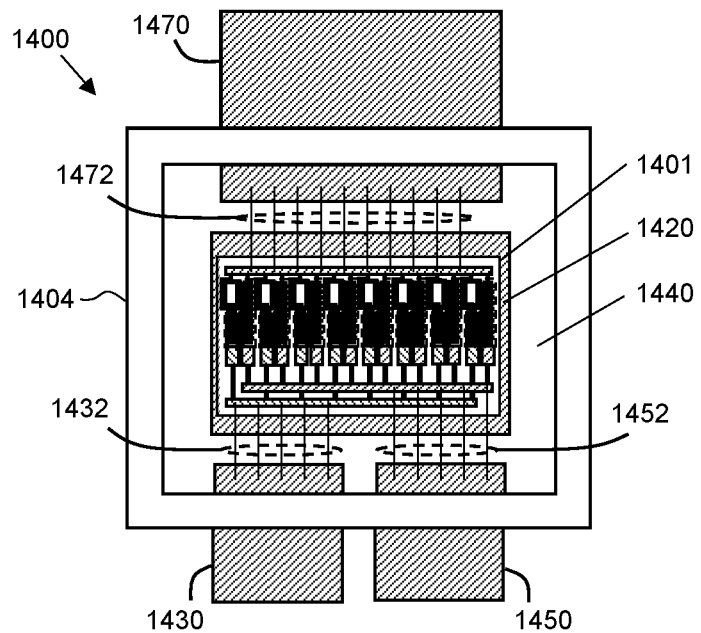
FIG. 14 is a top view of a Doherty amplifier device packaged in a high-power package, in accordance with an example embodiment.

By way of example, FIG. 14 is a top view of a Doherty amplifier device 1400 that includes a Doherty amplifier die 1401 (e.g., any of dies 301, 601, 701, 801, 901, 1001, 1101, 1201, 1301, FIGS. 3-13) packaged in a high-power, discrete device package 1404, in accordance with an example embodiment. Package 1404 includes carrier and peaking input signal leads 1430, 1450 and an output signal lead 1470. In some embodiments, package 1404 also may include one or more additional bias voltage or other leads. The input signal leads 1430, 1450 are positioned at an input side of the package 1404, and the output lead 1470 is positioned at an output side of the package 1404.

According to an embodiment, package 1404 includes a package substrate, such as a conductive flange 1420, to which Doherty amplifier die 1401 is physically and electrically connected (e.g., with conductive epoxy, solder, brazing, sintering, or other conductive connection methods). Finally, package 1404 includes non-conductive structural features or materials, such as molding compound and/or other insulating materials, which hold the leads 1430, 1450, 1470 and the flange 1420 in fixed orientations with respect to each other.

Electrically conductive connections, such as conductive wirebonds 1432, 1452, electrically connect input signal manifolds on die 1401 to the conductive leads 1430, 1450 on the input side of the package 1404. For example, one or more first wirebonds 1432 may electrically connect a carrier signal lead 1430 to a first bondpad corresponding to a carrier input signal manifold (e.g., manifold 330, FIG. 3), and the carrier signal lead 1430 may be used to convey an input carrier signal to the carrier fingers on die 1401. Similarly, one or more second wirebonds 1452 may electrically connect a peaking signal lead 1450 to a second bondpad corresponding to a peaking input signal manifold (e.g., manifold 350, FIG. 3), and the peaking signal lead 1450 may be used to convey an input peaking signal to the peaking fingers on die 1401. On the output side, one or more third wirebonds 1472 may electrically connect an output signal lead 1470 to a third bondpad corresponding to an output signal manifold (e.g., manifold 370, FIG. 3), and the output signal lead 1470 may be used to convey an amplified output signal produced by the die 1401.

In some embodiments, leads 1430, 1450, 1470 and flange 1420 may form portions of a lead frame. To complete an overmolded package during device manufacturing, after attachment of die 1401 and interconnection of wirebonds between the leads and the die 1401, the die 1401, the interior ends of leads 1430, 1450, 1470, the wirebonds, and the upper and side surfaces of flange 1420 may be encapsulated with a non-conductive (e.g., plastic) molding compound 1440 (only partially shown in FIG. 14 to avoid obscuring the interior components of device 1400). The molding compound 1440 defines the perimeter of the device 1400 from which leads 1430, 1450, 1470 protrude, and also defines the top surface of the device 1400. The bottom surface of the device 1400 is defined partially by the molding compound 1440, and partially by the bottom surface of flange 1420. Accordingly, when appropriately coupled to a system substrate (e.g., PCB 1510, FIG. 15), flange 1420 may function to convey a ground reference to the die 1401 (e.g., through the bottom conductive layer 428, FIG. 4), and also may function as a heat sink for the device 1400.

In a similar but different embodiment, leads 1430, 1450, 1470 with the configurations shown in FIG. 14 may be replaced with lands of a no-leads package. The flange 1420 and lands again may form a lead frame to which the die 1401 and wirebonds are attached, and again the assembly may be encapsulated with a non-conductive molding compound to form a no-leads, surface mount device (e.g., a DFN or QFN device).

In other embodiments, package 1404 may be an air-cavity package. In such an embodiment, flange 1420 may have a larger perimeter, which is equal or approximately equal to the perimeter of the device 1400. A non-conductive insulator (e.g., ceramic, plastic, or another material) with a frame shape may be attached to the top surface of the flange, leads 1430, 1450, 1470 may be placed over the non-conductive insulator, wirebonds are attached, and a cap (not illustrated) is placed over the frame opening to encase the interior components of the device 1400 in an air cavity.

Although FIG. 14 shows a Doherty amplifier device 1400 that includes a single Doherty amplifier die 1401 and corresponding leads, other embodiments of Doherty amplifier devices may include multiple Doherty amplifier dies (e.g., multiple instances of die 1401) placed side-by-side, with corresponding sets of leads associated with each die. Using such a device, the output RF signals from the multiple Doherty amplifier dies could be combined (e.g., on the PCB to which the Doherty amplifier device is coupled), for example, using a 3-dB coupler or other means. In addition, other embodiments of a Doherty amplifier device may include a signal splitter (e.g., corresponding to splitter 210, FIG. 2) and/or phase shifters (e.g., phase shifter 282, FIG. 2) located internally within the device package.

Figure 15:
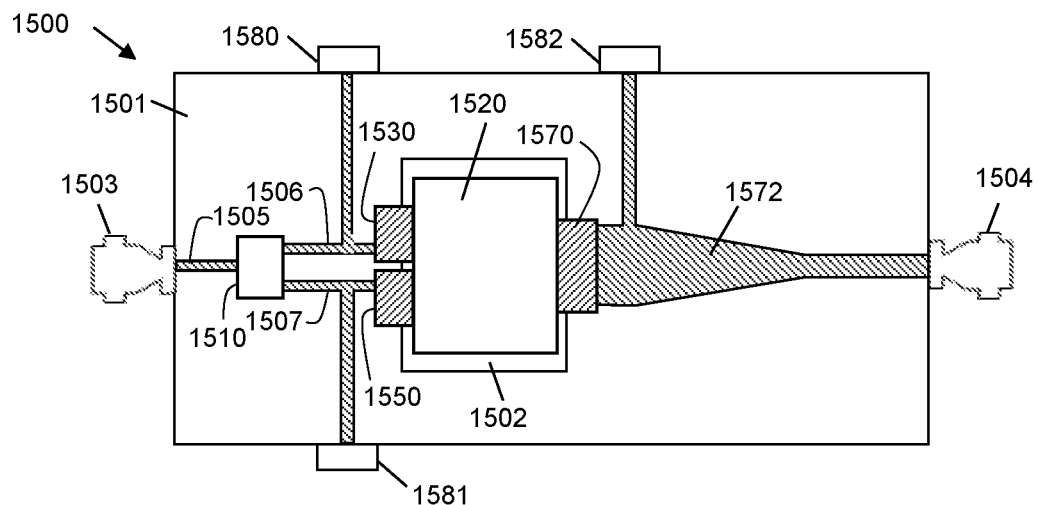
FIG. 15 is a top view of a packaged Doherty amplifier device coupled to a printed circuit board substrate, in accordance with an example embodiment.

Ultimately, Doherty amplifier device 1400 is incorporated into a larger electrical system (e.g., a power transmitter lineup in a cellular base station). For example, as illustrated in FIG. 15, a Doherty amplifier device 1520 (e.g., device 1400, FIG. 14) may be incorporated into amplifier system 1500 by coupling the Doherty amplifier device 1520 to a system substrate, such as a single-layer or multi-layer PCB 1501. The Doherty amplifier device 1520 includes carrier and peaking signal input leads 1530, 1550 (e.g., leads 1430, 1450, FIG. 14) and an output signal lead 1570 (e.g., lead 1470, FIG. 14), in an embodiment, which are configured to convey bias voltages and RF signals between conductive features of the PCB 1501 and a die (e.g., die 1401, FIG. 14) enclosed within the device 1420.

PCB 1501 may be a single-layer or multi-layer PCB, and a plurality of elements are coupled to the PCB 1501, in an embodiment. According to an embodiment, a conductive coin 1502 (or other feature) is embedded within the PCB 1501, and top and bottom surfaces of the conductive coin 1502 are exposed at top and bottom surfaces, respectively, of the PCB 1501. Doherty amplifier device 1520 (e.g., device 1400, FIG. 14) is connected to the conductive coin 1502. More specifically, the bottom surface (e.g., the bottom of flange 1420, FIG. 14) of the Doherty amplifier device 1520 may be physically and electrically connected to the top surface of the conductive coin 1502. The conductive coin 1502, in turn, may be electrically connected to system ground, and a bottom surface of the coin 1502 may be physically connected to a system heat sink. Accordingly, the conductive coin 1502 may function as a ground reference and a heat sink for the amplifier system 1500.

In a typical configuration, the amplifier system 1500 includes an input RF connector 1503 and an output RF connector 1504 coupled to the PCB 1501, which are configured, respectively, to receive an input RF signal from an RF signal source, and to produce an amplified output RF signal for transmission to a load (e.g., to load 106, FIG. 1, which may be a cellular antenna coupled to connector 1504).

The PCB 1501 includes a plurality of conductive paths 1505, 1506, 1507, 1572 that are electrically coupled between the input and output RF connectors 1503, 1504 and the Doherty amplifier device 1520. Additional conductive paths (not numbered) may be used to convey DC gate and drain bias voltages from bias voltage connectors 1580, 1581, 1582 to the device 1520. For example, the conductive paths and features on the PCB 1501 may be formed from patterned portions of a top conductive layer, a bottom conductive layer, and/or interior conductive layer(s) (if included) of the PCB 1501.

In the illustrated embodiment, a first conductive path 1505 electrically connects the input RF connector 1503 to an input of signal splitter 1510, which is configured to split an input RF signal conveyed through path 1505 into first and second RF signals (e.g., corresponding to carrier and peaking input RF signals). The first and second RF signals are produced at two outputs of signal splitter 1510, and the signals are conveyed to first and second RF input leads 1530, 1550 of Doherty amplifier device 1520 through second and third conductive paths 1506, 1507, respectively. According to an embodiment, signal splitter 1510 produces the first and second RF signals so that they have about 90 degrees of phase difference. In other embodiments, the phase difference may be imparted by circuitry that is distinct from the signal splitter 1510.

The Doherty amplifier device 1520 in the illustrated embodiment corresponds to a device that does not include an integrated signal splitter (e.g., splitter 210, FIG. 2). Instead, in the illustrated embodiment, the signal splitter 1510 is utilized to split an input RF signal into the first and second (e.g., carrier and peaking) RF signals. In alternate embodiments, a Doherty amplifier device 1520 may include an integrated signal splitter (e.g., splitter 210, FIG. 2), in which case signal splitter 1510 may be excluded from the system 1500, and the input RF connector 1503 may be directly connected to a single input lead through a single conductive path.

As discussed in detail above, a Doherty amplifier die within the Doherty amplifier device 1520 amplifies the input RF signal(s) to produce an amplified output RF signal at output lead 1570 (e.g., lead 1470, FIG. 14). An additional conductive path 1572 on the PCB 1501 electrically connects the output RF signal lead 1570 of the Doherty amplifier device 1520 to the output RF connector 1504. Accordingly, the amplified RF signal produced by the Doherty amplifier device 1520 is conveyed to the output RF connector 1504 through conductive path 1572 during operation of the system 1500.

Although the system of FIG. 15 shows a Doherty amplifier device 1520 mounted to PCB 1501, in other embodiments, the Doherty die (e.g., any of dies 301, 601, 701, 801, 901, 1001, 1101, 1201, 1301, FIGS. 3-13) may be directly mounted to a PCB to form a compact Doherty amplifier module. For example, such a module may include a multi-layer PCB, conductive bondpads or bottom-side lands configured to convey RF input and output signals, a Doherty die (e.g., any of dies 301, 601, 701, 801, 901, 1001, 1101, 1201, 1301, FIGS. 3-13) mounted to a surface of the PCB, an embedded heat sink (e.g., copper coin or thermal vias in the PCB) over which the Doherty die is mounted, a surface mounted or lumped element signal splitter with an RF input and two outputs (a carrier output and a peaking output), conductive paths (e.g., printed traces formed from patterned conductive layers of the PCB) between the RF input and the signal splitter, between the signal splitter and the Doherty die (e.g., one path for the carrier signal and one path for the peaking signal), and between the Doherty die and the output signal land or bondpad, and an input-side phase shifter (about 90 degrees) along one of the conductive paths between the splitter and the Doherty die. The module additionally may include bias voltage circuits or paths (to receive bias voltages from external circuitry).

Figure 16:
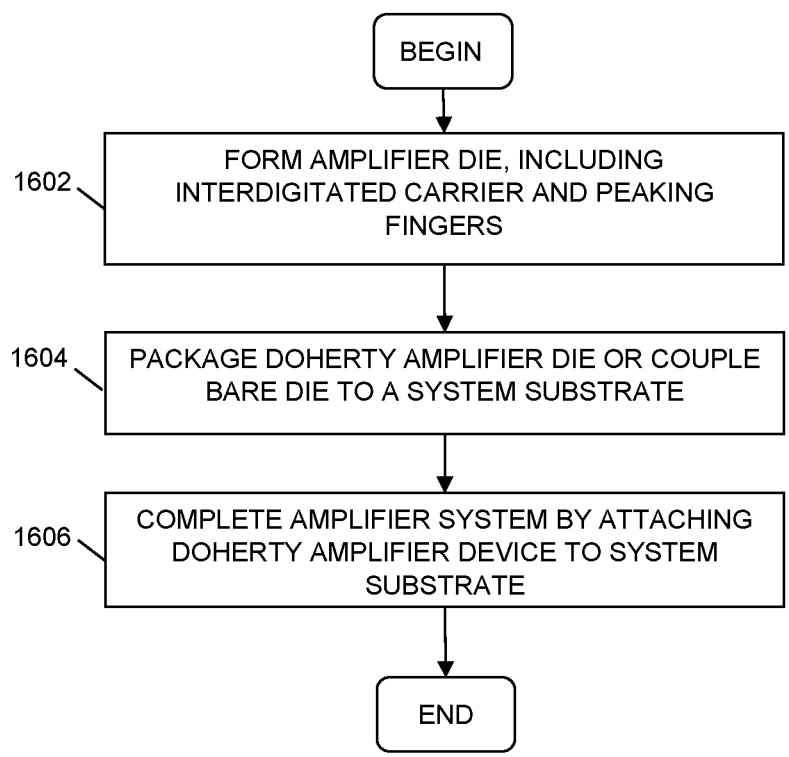
FIG. 16 is a flowchart of a method of making a Doherty power amplifier IC and a packaged Doherty amplifier device, in accordance with an example embodiment.

FIG. 16 is a flowchart of a method of making a Doherty power amplifier die (e.g., Doherty amplifier die 301, 601, 701, 801, 901, 1001, 1101, 1201, 1301, FIGS. 3-13), a packaged Doherty amplifier device (e.g., device 1400, FIG. 14), and a Doherty amplifier system (e.g., system 1500, FIG. 15), in accordance with an example embodiment. The method may begin, in block 1602, by forming an amplifier die (e.g., 301, 601, 701, 801, 901, 1001, 1101, 1201, 1301, FIGS. 3-13), which includes integrated carrier and peaking amplifiers that include interdigitated carrier and peaking amplifier fingers, as described in detail above.

In block 1604, the Doherty amplifier die may then be packaged. As mentioned previously, the Doherty amplifier die may be packaged in an overmolded or air-cavity package. Alternatively, the Doherty amplifier die may be attached as a bare die to a system substrate (e.g., a module or PCB substrate). When packaged in an overmolded package (e.g., package 1404, FIG. 14), the Doherty amplifier die may be connected to a conductive flange of a leadframe, wirebonds may be coupled between input, and output leads of the leadframe and appropriate bond pads of the Doherty amplifier die, and the flange, leads, and Doherty amplifier die may be encapsulated in molding compound. When packaged in an air-cavity package, an insulator frame may be attached to the top surface of a conductive flange, the Doherty amplifier die may be connected to the top surface of the flange in the frame opening, input and output leads may be connected to the top surface of the insulator frame, wirebonds may be coupled between the input and output leads and appropriate bond pads of the Doherty amplifier die, and a cap may be applied over the flange, insulator frame, leads, wirebonds, and Doherty amplifier die to encase the Doherty amplifier die in an air cavity.

In block 1606, the amplifier system may be completed by attaching the Doherty amplifier device (e.g., device 1400, FIG. 14) (or in some embodiments the bare die) to a system substrate, such as a PCB (e.g., PCB 1501, FIG. 15). More specifically, the bottom surface of the Doherty amplifier device may be connected to a conductive coin (e.g., coin 1502, FIG. 15) to provide a ground reference and heat sink to the device, and the device's input and output leads may be connected to corresponding conductive paths (e.g., paths 1505-1507, 1572, FIG. 15) of the system substrate.

According to an embodiment, additional components (e.g., splitter 1510, FIG. 15) may be coupled to the system substrate (e.g., PCB 1501, FIG. 15), to complete the amplifier system. The method may then end.

An embodiment of a multiple-path amplifier includes a semiconductor die, first and second amplifier input terminals and an amplifier output terminal integrally-formed with the semiconductor die, and at least two amplifier cells positioned between the amplifier input terminals and the amplifier output terminal. The at least two amplifier cells are positioned adjacent to each other. Each amplifier cell of the at least two amplifier cells includes a first transistor integrally-formed with the semiconductor die, and a second transistor integrally-formed with the semiconductor die. The first transistor has a first transistor input and a first transistor output, where the first transistor input is coupled to the first amplifier input terminal. The second transistor has a second transistor input and a second transistor output, where the second transistor input is coupled to the second amplifier input terminal. Each amplifier cell also includes a combining node coupled to the second transistor output and to the amplifier output terminal, and a first phase shift element electrically connected between the first transistor output and the combining node.

Another embodiment of an amplifier includes a semiconductor die, a first input signal manifold positioned at an input-side of the semiconductor die and integrally-formed with the semiconductor die, a second input signal manifold positioned at the input-side of the semiconductor die and integrally-formed with the semiconductor die, an output signal manifold positioned at an output-side of the semiconductor die and integrally-formed with the semiconductor die, and at least two amplifier cells positioned between the input-side and the output-side of the semiconductor die. The at least two amplifier cells are positioned adjacent to each other. Each amplifier cell of the at least two amplifier cells includes a first transistor integrally-formed with the semiconductor die, a second transistor integrally-formed with the semiconductor die, a combining node, and a phase shift element. The first transistor has a first transistor input and a first transistor output, where the first transistor input is coupled to the first amplifier input terminal. The second transistor has a second transistor input and a second transistor output, where the second transistor input is coupled to the second amplifier input terminal. The combining node is coupled to the second transistor output and to the amplifier output terminal. The phase shift element is electrically connected between the first transistor output and the combining node.

According to a further embodiment, the amplifier is a Doherty power amplifier, the first transistor is a first one of a carrier amplifier or a peaking amplifier, and the second transistor is another one of the carrier amplifier or the peaking amplifier. According to another further embodiment, the first transistor is a first elongated field effect transistor finger, the second transistor is a second elongated field effect transistor finger, and the phase shift element is an inductor.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or detailed description.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multiple-path amplifier comprising:
   a semiconductor die;
   first and second amplifier input terminals and an amplifier output terminal integrally-formed with the semiconductor die; and
   at least two amplifier cells positioned between the amplifier input terminals and the amplifier output terminal, wherein the at least two amplifier cells are positioned adjacent to each other, and each amplifier cell of the at least two amplifier cells includes:
      a first transistor integrally-formed within the semiconductor die, wherein the first transistor has a first transistor input and a first transistor output, wherein the first transistor input is coupled to the first amplifier input terminal, wherein the first transistor is a first field effect transistor that includes a first transistor finger comprising an elongated first drain region, an elongated first source region, and an elongated first gate terminal, wherein the first gate terminal is coupled to the first transistor input, and the first drain region is coupled to the first transistor output,
      a second transistor integrally-formed within the semiconductor die, wherein the second transistor has a second transistor input and a second transistor output, wherein the second transistor input is coupled to the second amplifier input terminal, wherein the second transistor is a second field effect transistor that includes a second transistor finger comprising an elongated second drain region, an elongated second source region, and an elongated second gate terminal, wherein the second gate terminal is coupled to the second transistor input, and the second drain region is coupled to the second transistor output,
      a combining node coupled to the second transistor output and to the amplifier output terminal, and
      a first phase shift element electrically connected between the first transistor output and the combining node.

2. The multiple-path amplifier of claim 1, wherein the first phase shift element comprises:
   a first inductor, wherein a first terminal of the first inductor is coupled to the first transistor output, and a second terminal of the first inductor is coupled to the combining node.

3. The multiple-path amplifier of claim 2, wherein the first inductor is a spiral inductor that is integrally-formed with the semiconductor die.

4. The multiple-path amplifier of claim 2, wherein the first inductor is a discrete inductor that is coupled to a top surface of the semiconductor die.

5. The multiple-path amplifier of claim 2, wherein the first inductor has an inductance value in a range from 0.1 nanohenry to 20 nanohenries.

6. The multiple-path amplifier of claim 2, wherein:
   a first drain-source capacitance is present between the elongated first drain region and the elongated first source region,
   a second drain-source capacitance is present between the elongated second drain region and the elongated second source region, and
   the first drain-source capacitance, the second drain-source capacitance, and the first inductor result in a 90-degree phase delay being imparted to a radio frequency signal conveyed between the first drain region and the combining node.

7. The multiple-path amplifier of claim 1, wherein a first length of the first transistor finger is shorter than a second length of the second transistor finger.

8. The multiple path amplifier of claim 7, wherein the first and second transistor fingers have input ends that are aligned along a first line that is perpendicular to the first and second lengths of the first and second transistor fingers, the second transistor finger has an output end that is aligned along a second line that is perpendicular to the first and second lengths of the first and second transistor fingers, and the first phase shift element is positioned between an output end of the first transistor finger and the second line.

9. The multiple-path amplifier of claim 1, wherein a first length of the first transistor finger is substantially equal to a second length of the second transistor finger.

10. The multiple-path amplifier of claim 1, wherein the first transistor finger and the second transistor finger are directly adjacent to each other.

11. The multiple-path amplifier of claim 1, wherein the multiple-path amplifier is a Doherty power amplifier, the first transistor finger is a carrier finger, and the second transistor finger is a peaking finger.

12. The multiple-path amplifier of claim 1, wherein the multiple-path amplifier is a Doherty power amplifier, the first transistor finger is a peaking finger, and the second transistor finger is a carrier finger.

13. The multiple-path amplifier of claim 1, wherein each amplifier cell is an asymmetric amplifier cell.

14. The multiple-path amplifier of claim 1, wherein each amplifier cell is a symmetric amplifier cell.

15. The multiple-path amplifier of claim 1, wherein the at least two amplifier cells include from two to fifty amplifier cells.

16. The multiple-path amplifier of claim 1, wherein each amplifier cell further comprises:
- a third transistor integrally-formed with the semiconductor die, wherein the third transistor has a third transistor input and a third transistor output, wherein the third transistor input is coupled to a third amplifier input terminal, and
- a second phase shift element electrically connected between the third transistor output and a node between the first transistor output and the first phase shift element.

17. A multiple-path amplifier comprising:
a semiconductor die;
first and second amplifier input terminals and an amplifier output terminal integrally-formed with the semiconductor die;
at least two amplifier cells positioned between the amplifier input terminals and the amplifier output terminal, wherein the at least two amplifier cells are positioned adjacent to each other, and each amplifier cell of the at least two amplifier cells includes:
- a first transistor integrally-formed within the semiconductor die, wherein the first transistor has a first transistor input and a first transistor output, wherein the first transistor input is coupled to the first amplifier input terminal,
- a second transistor integrally-formed within the semiconductor die, wherein the second transistor has a second transistor input and a second transistor output, wherein the second transistor input is coupled to the second amplifier input terminal,
- a combining node coupled to the second transistor output and to the amplifier output terminal, and
a first phase shift element electrically connected between the first transistor output and the combining node; and
one or more electromagnetic isolation features positioned between the first transistor and the second transistor.

18. A multiple-path amplifier comprising:
a semiconductor die;
first and second amplifier input terminals and an amplifier output terminal integrally-formed with the semiconductor die;
at least two amplifier cells positioned between the amplifier input terminals and the amplifier output terminal, wherein the at least two amplifier cells are positioned adjacent to each other, and each amplifier cell of the at least two amplifier cells includes:
- a first transistor integrally-formed within the semiconductor die, wherein the first transistor has a first transistor input and a first transistor output, wherein the first transistor input is coupled to the first amplifier input terminal,
- a second transistor integrally-formed within the semiconductor die, wherein the second transistor has a second transistor input and a second transistor output, wherein the second transistor input is coupled to the second amplifier input terminal,
- a combining node coupled to the second transistor output and to the amplifier output terminal, and
a first phase shift element electrically connected between the first transistor output and the combining node; and
one or more electromagnetic isolation features positioned between adjacent ones of the at least two amplifier cells.

19. An amplifier comprising:
a semiconductor die;
a first input signal manifold positioned at an input-side of the semiconductor die and integrally-formed with the semiconductor die;
a second input signal manifold positioned at the input-side of the semiconductor die and integrally-formed with the semiconductor die;
an output signal manifold positioned at an output-side of the semiconductor die and integrally-formed with the semiconductor die; and
at least two amplifier cells positioned between the input-side and the output-side of the semiconductor die, wherein the at least two amplifier cells are positioned adjacent to each other, and each amplifier cell of the at least two amplifier cells includes:
- a first transistor integrally-formed within the semiconductor die, wherein the first transistor has a first transistor input and a first transistor output, wherein the first transistor input is coupled to the first amplifier input terminal,
- a second transistor integrally-formed within the semiconductor die, wherein the second transistor has a second transistor input and a second transistor output, wherein the second transistor input is coupled to the second amplifier input terminal,
- a combining node coupled to the second transistor output and to the amplifier output terminal, and
- a phase shift element electrically connected between the first transistor output and the combining node.

20. The amplifier of claim 19, wherein the amplifier is a Doherty power amplifier, the first transistor is a first one of a carrier amplifier or a peaking amplifier, and the second transistor is another one of the carrier amplifier or the peaking amplifier.

21. The amplifier of claim 19, wherein:
the first transistor is a first elongated field effect transistor finger;
the second transistor is a second elongated field effect transistor finger; and
the phase shift element is an inductor.

* * * * *